(12) United States Patent
Lee et al.

(10) Patent No.: US 8,692,250 B2
(45) Date of Patent: Apr. 8, 2014

(54) THIN FILM TRANSISTOR ARRAY SUBSTRATE AND METHOD FOR FABRICATING THE SAME

(75) Inventors: Ming-Hsien Lee, Kaohsiung (TW); Ching-Chieh Shih, Kinmen County (TW); An-Thung Cho, Hualien County (TW); Chia-Tien Peng, Hsinchu County (TW); Kun-Chih Lin, Miaoli County (TW)

(73) Assignee: Au Optronics Corporation, Hsinchu (TW)

( * ) Notice: Subject to any disclaimer, the term of this patent is extended or adjusted under 35 U.S.C. 154(b) by 1060 days.

(21) Appl. No.: 12/269,041

(22) Filed: Nov. 12, 2008

(65) Prior Publication Data

US 2010/0012937 A1    Jan. 21, 2010

(30) Foreign Application Priority Data

Jul. 21, 2008  (TW) ............................... 97127655 A

(51) Int. Cl.
  *H01L 29/04*  (2006.01)
(52) U.S. Cl.
  USPC ..................... 257/59; 257/E29.151; 438/149
(58) Field of Classification Search
  USPC ............................ 257/29.151; 438/149; 349/2
  See application file for complete search history.

(56) References Cited

U.S. PATENT DOCUMENTS

| | | | | |
|---|---|---|---|---|
| 4,957,772 A | * | 9/1990 | Saitoh et al. | 427/575 |
| 2002/0076844 A1 | * | 6/2002 | Possin et al. | 438/30 |
| 2006/0180816 A1 | | 8/2006 | Li et al. | |
| 2007/0109435 A1 | * | 5/2007 | Takahashi | 348/307 |

FOREIGN PATENT DOCUMENTS

TW         I287628         10/2007

* cited by examiner

*Primary Examiner* — Thao Le
*Assistant Examiner* — Matthew Gordon
(74) *Attorney, Agent, or Firm* — Jianq Chyun IP Office

(57) ABSTRACT

A method for fabricating a TFT array substrate including the following steps is provided. A substrate having a pixel region and a photosensitive region is provided. A first patterned conductive layer is formed on the substrate, wherein the first patterned conductive layer includes a gate electrode disposed in the pixel region and a first electrode disposed in the photosensitive region, and a photosensitive dielectric layer is formed on the first electrode. A gate insulation layer is formed to cover the gate electrode, the photosensitive dielectric layer and the first electrode. A patterned semiconductor layer is formed on the gate insulation layer above the gate electrode. A source electrode and a drain electrode are formed on the patterned semiconductor layer at two sides of the gate electrode, wherein the gate electrode, the source electrode, and the drain electrode constitute a TFT. A second electrode is formed on the photosensitive dielectric layer.

34 Claims, 20 Drawing Sheets

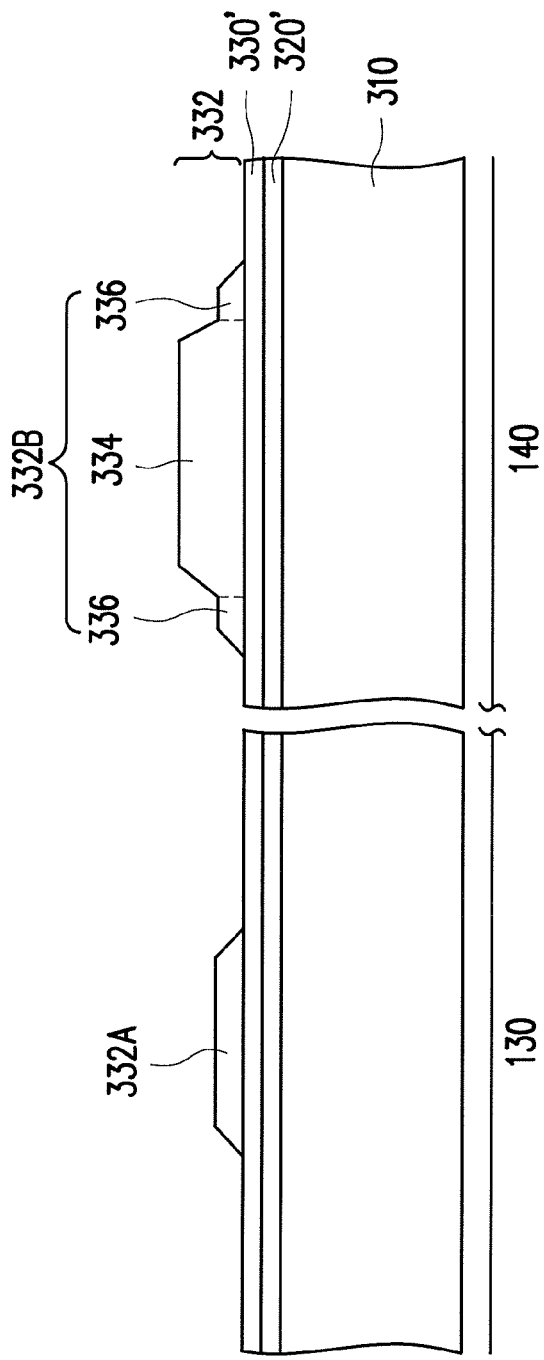
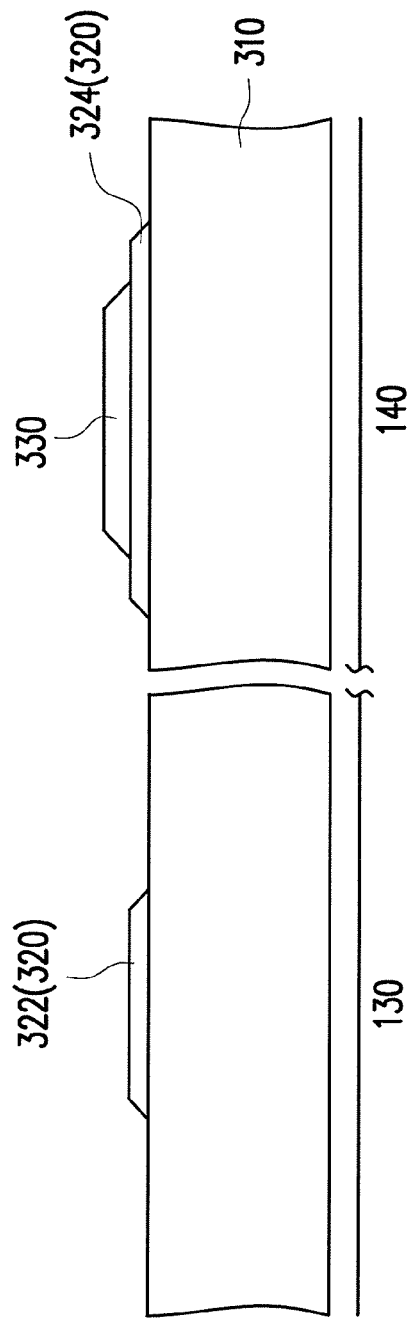
FIG. 3A
FIG. 3B

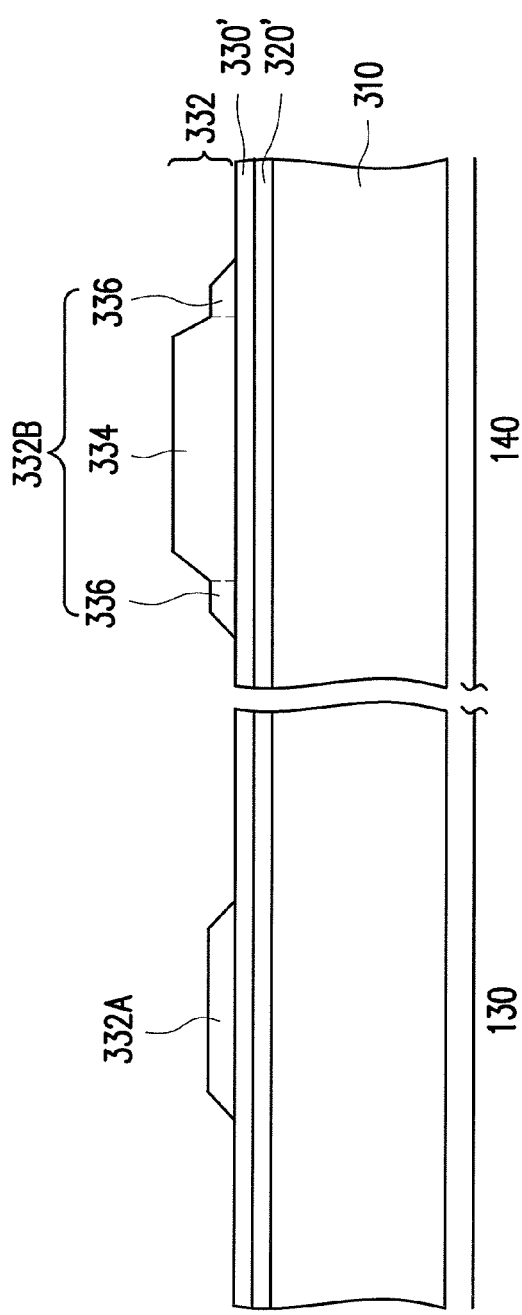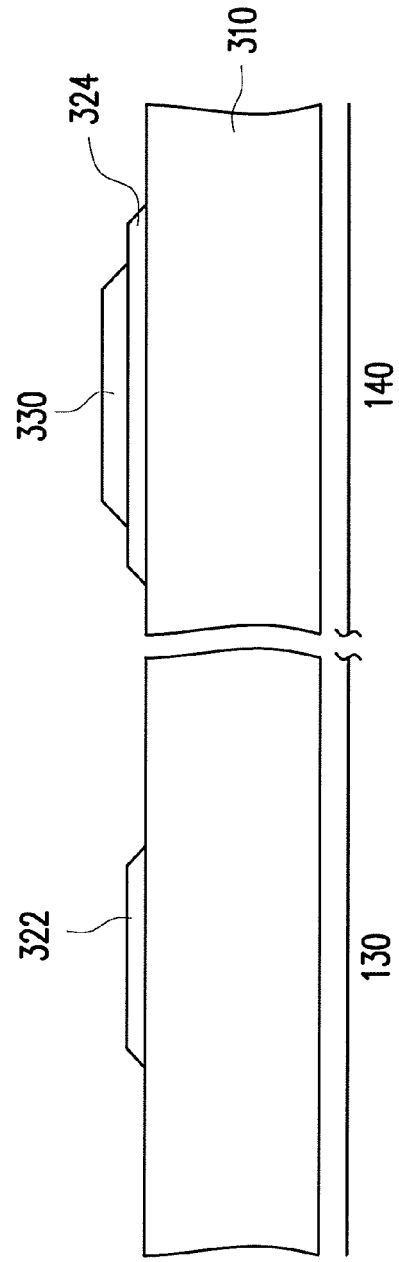

THIN FILM TRANSISTOR ARRAY SUBSTRATE AND METHOD FOR FABRICATING THE SAME

CROSS-REFERENCE TO RELATED APPLICATION

This application claims the priority benefit of Taiwan application serial no. 97127655, filed on Jul. 21, 2008. The entirety of the above-mentioned patent application is hereby incorporated by reference herein and made a part of this specification.

BACKGROUND OF THE INVENTION

1. Field of the Invention

The present invention generally relates to a thin film transistor (TFT) array substrate and a method for fabricating the same, and more particularly, to a TFT array substrate having a photosensor, and a method for fabricating the same.

2. Description of Related Art

As science and technology being developed, great improvements have been made with respect to technologies for display devices, and accordingly the demand for display devices is drastically increasing. In the earlier days, cathode ray tube (CRT) displays presented outstanding displaying performance and mature techniques comparing with other kinds. Therefore, the CRT displays had almost exclusively occupied the display market for a very long period. However, the green concept of environmental protection has been paid with more attention, and therefore the CRT displays which consume a lot of energy and generate a large amount of radiation, and even often occupy a large 3D space, are now incapable of satisfying the new trend of display devices, (e.g., being lighter, thinner, shorter, smaller, cuter, and lower power consumption), demanded by the current market. As such, flat panel displays (FPD) which are lighter and thinner now gradually displace the position of those bulky CRT displays in the market. Specifically, liquid crystal displays (LCD), as an important representative of FPDs, having outstanding advantages such as improved imaging performance, optimal space utilization efficiency, low power consumption, and low radiation, have become a mainstream of the display market.

Recently, it has been proposed to integrate a photosensor into an FPD, in order to improve an operation convenience of a display interface between a user and the FPD, or for the purpose of improving the entire displaying quality of the FPD. Specifically, the photosensor is adapted to serve as an input apparatus of an optical touch panel, in which when a user uses his finger or other means to touch the optical touch panel, the photosensor integrated inside the LCD panel detects a variation of light and outputs a corresponding signal to execute a corresponding function or operation. In another application, the photosensor is integrated in an FPD serving as an ambient light sensor for detecting an intensity of the ambient light.

More specifically, when selecting photosensitive materials for making the photosensor, amorphous silicon material having a higher light sensitivity, (i.e., a photocurrent in an amorphous material has a larger variation range relative to a change of light intensity), will usually be more often considered. Therefore, when trying to integrate a photosensor to an amorphous silicon TFT array substrate, the amorphous silicon material is often used between two electrodes to constitute the photosensor.

However, when using the amorphous silicon material as a photosensitive material for making the photosensor, a difficulty may occur. Even when there is no voltage applied on the two electrodes over the amorphous silicon, if only the amorphous silicon material is illuminated by a light, the photosensor will be caused with a problem of photocurrent attenuation, and thus affecting the reliability of the photosensor.

As such, it is very desirable to properly design the structure and position of the photosensitive material in the photosensor, so as to achieve a higher reliability of the photosensor. Further, it is also a critical concern to compatibly integrating the process of fabricating the photosensor into the entire process of fabricating the amorphous silicon TFT.

SUMMARY OF THE INVENTION

Accordingly, the present invention is directed to provide a method for fabricating a TFT array substrate, which is adapted for integrating a process of fabricating a photosensitive unit into a process of fabricating a TFT, in which the photosensitive unit has a high photocurrent reliability.

The present invention is further directed to provide a TFT array substrate having a highly reliable photosensitive unit.

According to an embodiment of the present invention, a photosensitive dielectric material layer is formed right after a step of forming a first conductive layer, and therefore the photosensitive dielectric material layer can be configured with a film at a relative high temperature, which is helpful to improve a photocurrent of the photosensitive dielectric layer, and thus improving the current-illumination characteristic performance of the photosensor.

The present invention provides a method for fabricating a TFT array substrate. The method includes: first, providing a substrate having a pixel region and a photosensitive region; then forming a first patterned conductive layer on the substrate, in which the first patterned conductive layer includes a gate electrode disposed in the pixel region and a first electrode disposed in the photosensitive region, and a photosensitive dielectric layer is formed on the first electrode; then, forming a gate insulation layer on the substrate covering the gate electrode, the photosensitive dielectric layer and the first electrode; then, forming a patterned semiconductor layer on the gate insulation layer above the gate electrode; then, forming a source electrode and a drain electrode on the patterned semiconductor layer at two sides of the gate electrode, respectively, the gate electrode, the source electrode, and the drain electrode configuring a TFT; then, forming a second electrode on the photosensitive dielectric layer, so that the first electrode, the photosensitive dielectric layer and the second electrode configure a photosensor.

According to an embodiment of the present invention, after forming the source electrode and the drain electrode, the method for fabricating the TFT array substrate further includes forming a protection layer entirely on the substrate after forming the source electrode and the drain electrode. Further, the method for fabricating the TFT array substrate may further includes the steps of: first, removing a part of the protection layer on the TFT, to configure a first opening exposing a part of the source electrode or the drain electrode; then, removing a part of the protection layer in the photosensitive region and a part of the gate insulation layer thereunder, to configure a second opening exposing a part of the photosensitive dielectric layer.

According to an embodiment of the present invention, the step of forming the second electrode on the photosensitive dielectric layer further includes: forming a pixel electrode connected to the TFT, in which a process of forming the second electrode and the pixel electrode further includes the steps of: first, forming a transparent conductive layer on the protection layer; then patterning the transparent conductive layer to form the pixel electrode and the second electrode, in which the pixel electrode is electrically connected to the source electrode or the drain electrode via the first opening, and the second electrode is connected to the photosensitive dielectric layer via the second opening.

According to an embodiment of the present invention, the photosensitive dielectric layer for example is a silicon rich dielectric layer, such as a silicon rich oxide layer, a silicon rich nitride layer, or a silicon rich carbide layer. Further, the silicon rich oxide can be represented with a molecular formula of $SiO_x$, in which $0.1 \leq x \leq 1.9$.

According to an embodiment of the present invention, the photosensitive dielectric layer has a refractive index ranging from 1.8 to 3.7.

According to an embodiment of the present invention, the gate electrode, the first electrode, and the photosensitive dielectric layer are formed by a method including the steps of: first sequentially forming a first conductive layer, a photosensitive dielectric material layer entirely on the substrate; then, forming a patterned photoresist layer on the photosensitive dielectric material layer, in which the patterned photoresist layer includes a first photoresist block and a second photoresist block, in which the first photoresist block is positioned in the pixel region, the second photoresist block is positioned in the photosensitive region, and a thickness of the second photoresist block is greater than a thickness of the first photoresist block; then taking the patterned photoresist layer as a mask, to remove the exposed first conductive layer and photosensitive dielectric material layer, so that the rest first conductive layer and photosensitive dielectric material layer in the photosensitive region constitute the first electrode and the photosensitive dielectric layer, respectively; then, reducing a thickness of the patterned photoresist layer, until the first photoresist block is removed; then, taking the rest patterned photoresist layer as a mask, to remove the exposed photosensitive dielectric material layer, so that the rest first conductive layer in the pixel region constitutes the gate electrode. The second photoresist block may further includes a central block and two lateral blocks, in which the central block is positioned between the lateral blocks, and a thickness of the central block is greater than a thickness of the two lateral blocks. Further, the thickness of the patterned photoresist layer can be reduced by an ashing process.

According to an embodiment of the present invention, the patterned semiconductor layer in the pixel region further includes a channel layer, and an ohmic contact layer on the channel layer. Further, when forming the source electrode and the drain electrode, the method further includes removing the ohmic contact layer exposed by the source electrode and the drain electrode and a part of the channel layer.

According to an embodiment of the present invention, the patterned semiconductor layer is formed by a method including the steps of: forming a semiconductor layer covering the gate insulation layer; and then patterning the semiconductor layer.

According to an embodiment of the present invention, the source electrode and the drain electrode are formed by a method including the steps of: first forming a second conductive layer covering the patterned semiconductor layer and the gate insulation layer; and then patterning the second semiconductor layer, thus forming the source electrode and the drain electrode.

According to an embodiment of the present invention, the gate electrode dielectric layer, the patterned semiconductor layer, the source electrode, and the drain electrode are formed at the same time, and the patterned semiconductor layer, the source electrode, and the drain electrode are formed at the same time by a method including the steps of: sequentially forming a gate insulation layer, a semiconductor layer, a second conductive layer, and a patterned photoresist layer entirely on the substrate, in which the patterned photoresist layer includes a first photoresist block and a second photoresist block positioned at two sides of the first photoresist block, in which a thickness of the first photoresist block is smaller than a thickness of the second photoresist block; then taking the patterned photoresist layer as a mask to perform a first etching process to the second conductive layer and the semiconductor layer; then reducing a thickness of the patterned photoresist layer, until the first photoresist block is completely removed; then, taking the rest second photoresist block as a mask to perform a second etching process to the second conductive layer, thus configuring the second conductive layer to form the source electrode and the drain electrode, and configuring the semiconductor layer to form the patterned semiconductor layer.

According to an embodiment of the present invention, the protection layer is made of an organic insulation material.

According to an embodiment of the present invention, the protection layer is a stack constituted by an inorganic insulation material and an organic insulation material.

According to an embodiment of the present invention, the method for fabricating a TFT array substrate further includes the steps of: first, after forming the source electrode and the drain electrode, forming a protection layer covering the source electrode, the drain electrode, and the gate insulation layer; then, forming a photoresist layer for covering the protection layer; then, patterning the photoresist layer to form a patterned photoresist layer, the patterned photoresist layer exposing a part of the protection layer over the TFT and a part of the protection layer over the photosensitive dielectric layer; then, taking the patterned photoresist layer as a mask to perform an etching process to remove the part of protection layer over the TFT, and remove a part of the protection layer of the photosensitive region, and a part of the gate insulation layer, so as to expose the drain electrode or the source electrode, and expose the photosensitive dielectric layer; then, forming a transparent conductive layer on the substrate, entirely covering the substrate; then, performing a peeling off process to simultaneously remove the patterned photoresist layer and the transparent conductive layer on the patterned photoresist layer, and thus a part of the rest transparent conductive layer which connects to the source electrode or the drain electrode constituting the pixel electrode, and a part of the rest transparent conductive layer which connects to the photosensitive dielectric layer constituting the second electrode.

According to an embodiment of the present invention, the photosensitive region is disposed at a peripheral of the pixel region. Further, an amount of photosensitive region for example is a plurality, and each photosensitive region is correspondingly formed in a range of each pixel region.

The present invention further provides a TFT array substrate. The TFT array substrate includes a substrate, a patterned first conductive layer, a photosensitive dielectric layer, a gate insulation layer, a patterned semiconductor layer, a source electrode, a drain electrode, and a second electrode. The substrate includes a pixel region and a photosensitive region. The patterned first conductive layer is disposed on the substrate. The first conductive layer includes a gate electrode in the pixel region and a first electrode in the photosensitive region. The photosensitive dielectric layer is disposed on the first electrode. The gate insulation layer covers the gate electrode, the photosensitive dielectric layer and the first electrode. The patterned semiconductor layer is disposed on the gate insulation layer over the gate electrode. The source electrode and the drain electrode are disposed on the patterned semiconductor layer at two sides of the gate electrode. The gate electrode, the source electrode, and the drain electrode constitute a TFT. The second electrode is disposed on the photosensitive dielectric layer, in which the first electrode, the photosensitive dielectric layer and the second electrode constitute a photosensor.

According to an embodiment of the present invention, the TFT array substrate further includes a protection layer covering the source electrode and the drain electrode. The protection layer for example is formed with a first opening and a second opening. The first opening exposes a part of the source electrode or a part of the drain electrode. The second opening exposes a part of the photosensitive dielectric layer. The TFT array substrate further includes a pixel electrode. The pixel electrode and the second electrode for example are made of a same material. The pixel electrode is electrically connected to the source electrode or the drain electrode via the first opening. The second electrode is connected to the photosensitive dielectric layer via the second opening.

According to an embodiment of the present invention, the photosensitive dielectric layer for example is a silicon rich dielectric layer.

According to an embodiment of the present invention, the silicon rich dielectric layer is a silicon rich oxide layer, a silicon rich nitride layer, or a silicon rich carbide layer. Further, the silicon rich oxide can be represented by a molecule formula of $SiO_x$, in which $0.1 \leq x \leq 1.9$.

According to an embodiment of the present invention, the photosensitive dielectric layer has a refractive index in a range of 1.8 to 3.7.

According to an embodiment of the present invention, the photosensitive dielectric material layer is formed right after the step of forming the first conductive layer, and therefore the photosensitive dielectric material layer can be configured with a film at a relative high processing temperature, so as to improve the current-illumination characteristic performance of the photosensor. The photosensitive dielectric layer can be processed by a mask which is also shared by the gate electrode, and the first electrode for fabrication, and is highly compatible with the process of the TFT array substrate, and thus would not introduce additional production cost for mask.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 3A through 3F illustrate a flow of fabricating a TFT array substrate according to an embodiment of the present invention.

FIG. 3F' is a schematic diagram illustrating a TFT array substrate according to another embodiment of the present invention.

FIGS. 4A through 4F further illustrate a flow of fabricating a TFT array substrate according to an embodiment of the present invention.

DESCRIPTION OF THE EMBODIMENTS

Figure 1A:
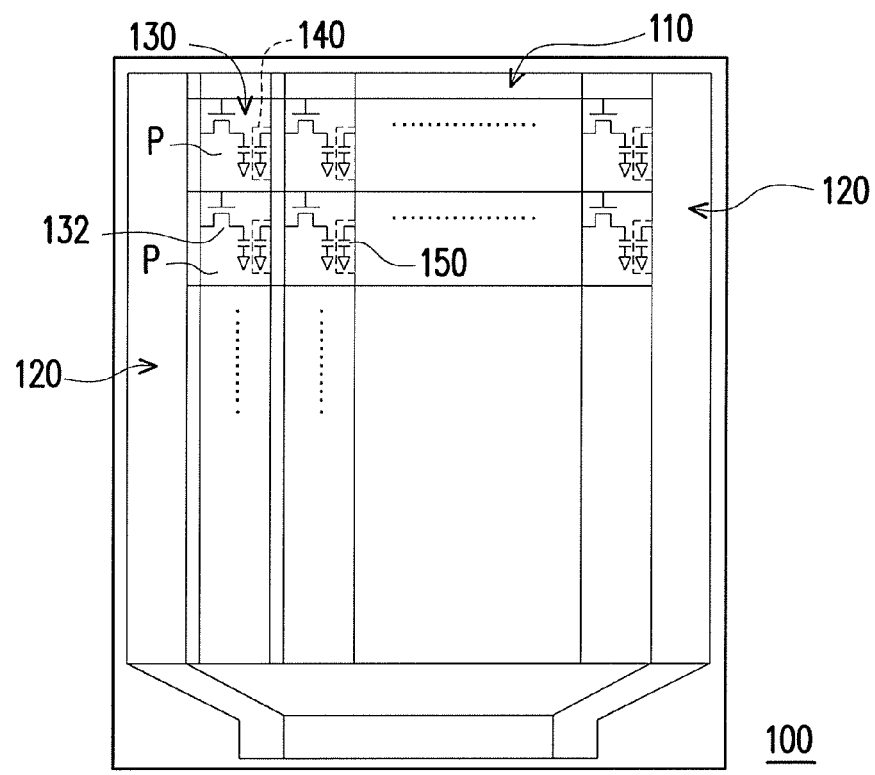
FIGS. 1A and 1B each illustrates a layout of a TFT array substrate including a photosensor integrated therein according to an embodiment of the present invention, respectively.

Reference will now be made in detail to the present preferred embodiments of the invention, examples of which are illustrated in the accompanying drawings. Wherever possible, the same reference counting numbers are used in the drawings and the description to refer to the same or like parts.

Figure 1B:
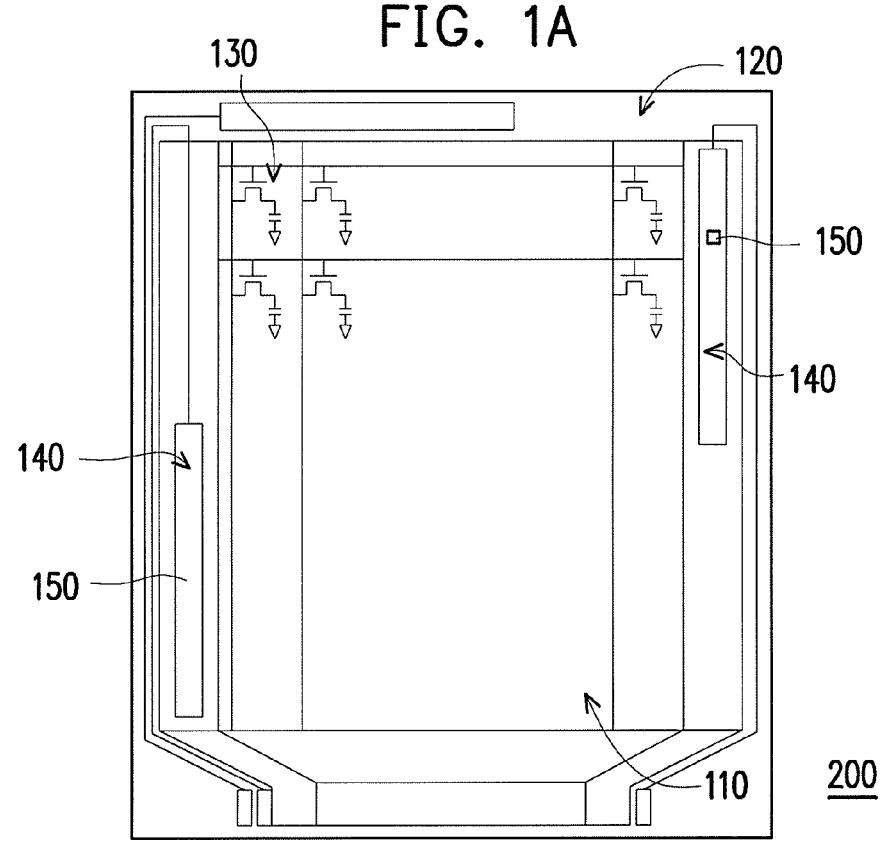

FIGS. 1A and 1B each illustrates a layout of a thin film transistor (TFT) array substrate including a photosensor integrated therein according to an embodiment of the present invention, respectively. Referring to FIG. 1A, it shows a TFT array substrate 100 at least including a display region 110, and a peripheral circuit region 120 disposed at a periphery of the display region 110. The display region 110 includes a plurality of pixel regions 130 arranged in an array. When such a TFT array substrate 100 is applied in a liquid crystal display (LCD), a plurality of pixel units P in the pixel regions 130 are adapted for displaying an image. The peripheral circuit region 120 can be equipped with driving units, such as a scan driver or a data driver (not shown in the drawing). The TFT array substrate 100 includes a photosensitive region 140 for disposing a photosensor 150 thereon. According to different applications, the photosensitive region 140 can be disposed in different positions on the TFT array substrate 100.

More specifically, as shown in FIG. 1A, there are a plurality of photosensitive regions 140, and according to the instant embodiment, each photosensitive region 140 is disposed in a range of a corresponding pixel region 130. According to another embodiment, the photosensor 150 can also be disposed in that a plurality of pixel regions 130 are attributed to a group, and each photosensitive region 140 is correspondingly disposed in each group of pixel regions 130. The present invention does not restrict the amounts of the photosensitive regions 140 and the corresponding pixel regions 130, as well as the relative position thereof. In practical operation, a user can put a finger or another object over the photosensor 150 to cause a variation of light intensity. When two electrodes of the photosensor 150 are being applied with an operation voltage, the photosensor 150 is allowed to correspondingly generate and output signals according to variations of the light intensity for executing different functions. Specifically, in the current embodiment, the photosensor 150 is operated in a shading sensing mode, in which a touch of the finger or the object will shade the light over the photosensor 150 (to be further discussed later). In such a way, the photosensor 150 outputs corresponding signals for touch controlling. In other words, the shading sensing mode is to execute a touch sensing by sensing a variation of an ambient light when being shaded. Displays employing TFT array substrates 100 of such a shading sensing mode can include touch panels directly built-in the display panels, so as to achieve more convenience of designing man-machine interfaces (MMI).

Referring to FIG. 1B, the photosensitive regions 140 can also be selectively disposed at a periphery of the entirety of the pixel regions 130. In other words, the photosensitive regions 140 can also be selectively disposed at suitable positions of the peripheral circuit region 120, which is not restricted by the present invention. As shown in FIG. 1B, in a display using a TFT array substrate 200 of this mode, the photosensor 150 detects an intensity of the ambient light, and converts a variation of the intensity of the ambient light into a photoelectric signal. The photoelectric signal is fed back to an output of a backlight source electrode. Therefore, an intensity of the output of the backlight source electrode of the display can be adjusted for power saving. Meanwhile, upon the detection of the intensity of the ambient light, brightness and contrary of the LCD display panel can be automatically adjusted. In such a way, eye fatigue caused by high brightness and reflected light can be relieved, and the power consumption of the LCD panel can be saved.

Figure 2:
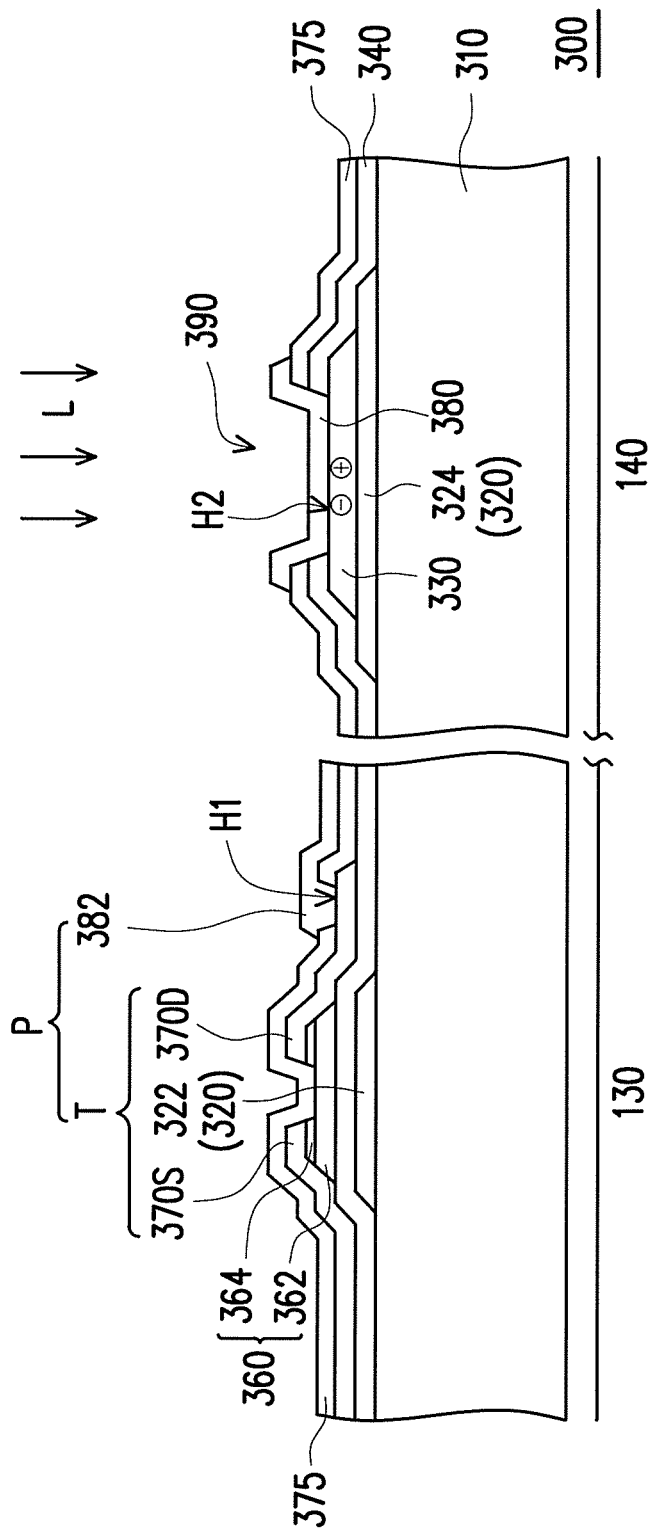
FIG. 2 is a schematic diagram of a partial cross-sectional view of a TFT array substrate 300 of FIG. 1A or FIG. 1B.

FIG. 2 is a schematic diagram of a partial cross-sectional view for further illustrating a TFT array substrate of FIG. 1A or FIG. 1B. In FIG. 2, for simplification and convenience of illustration, those elements of pluralities maybe exemplified by only one of them. Referring to FIG. 2, it shows a TFT array substrate 300. The TFT array substrate 300 includes a substrate 310, a patterned first conductive layer 320, a photosensitive dielectric layer 330, a gate insulation layer 340, a patterned semiconductor layer 360, a source electrode 370S, a drain electrode 370D, and a second electrode 380. As discussed above, the substrate 310 includes a pixel region 130 and a photosensitive region 140 disposed thereon, in which the relative position of the photosensitive region 140 to the pixel region 130 is not restricted by the present invention.

Referring to FIG. 2, the patterned first conductive layer 320 is disposed on the substrate 310. The patterned first conductive layer 320 includes a gate electrode 322 in the pixel region 130, and a first electrode 324 in the photosensitive region 140. The photosensitive dielectric layer 330 is disposed on the first electrode 324. The photosensitive dielectric layer 330 has a refractive index in a range of 1.8 to 3.7. The photosensitive dielectric layer 330 for example is a silicon rich dielectric layer. It should be noted that, the term "silicon rich" here indicates that the silicon content in the dielectric layer exceeds a normal chemical ratio (chemical equivalent), or in other words, the dielectric layer includes excessive silicon content. Specifically, the silicon rich dielectric layer for example is a silicon rich oxide having a molecular formula of $SiO_x$, in which $0.1 \leq x \leq 1.9$. Further, materials suitable for making the silicon rich dielectric layer include: silicon rich oxide ($SiO_x$), silicon rich nitride ($SiN_y$), and silicon rich carbide ($SiC_z$), or the like, in which x ranges between 0.01 to 2 and preferably ranges between 0.1 to 1.9; y ranges from 0.01 to 1.33; and z ranges from 0.01 to 1. However, the present invention is not restricted to use the foregoing material for making the photosensitive dielectric layer 330, and other silicon rich composite can also be used.

Further referring to FIG. 2, the gate insulation layer 340 covers the gate electrode 322, the photosensitive dielectric layer 330, and the first electrode 324. The gate insulation layer 340 for example is made of a dielectric layer, such as silicon oxide, silicon nitride, silicon oxynitride, or a stack of the foregoing. The patterned semiconductor layer 360 is disposed on the gate insulation layer 340 over the gate electrode 322. In the current embodiment, the patterned semiconductor layer 360 includes a channel layer 362, and an ohmic contact layer 364 disposed on the channel layer 362. The channel layer 362 and the ohmic contact layer 364 for example are made of amorphous silicon and N-type heavily doped amorphous silicon, respectively. The source electrode 370S and the drain electrode 370D are disposed on the patterned semiconductor layer 360 at two sides of the gate electrode 322. The terminologies of the source electrode 370S and the drain electrode 370D can actually be exchanged, according to the electrical demand thereof.

The gate electrode 322, the source electrode 370S and the drain electrode 370D in the pixel region 130 constitute a TFT T. Such TFTs T are arranged on the substrate 310 as an array as shown in FIGS. 1A and 1B, thus configuring a TFT array substrate 300. Further, the second electrode 380 is disposed on the photosensitive dielectric layer 330. In such a way, the first electrode 324 in the photosensitive region 140, the photosensitive dielectric layer 330, and the second electrode 380 constitute a photosensor 390. It should be noted that in the current embodiment, the first electrode 324 and the second electrode 380 for example are made of a metal material and a transparent conductive material, respectively. As such, when the ambient light is transmitted through the second electrode 380 and illuminates upon the photosensitive dielectric layer 330, electron-hole pairs are generated in the photosensitive dielectric layer 330. When a voltage is applied over the first electrode 324 and the second electrode 380, the electrons and the holes of the electron-hole pairs are separated each other, and flow toward the first electrode 324 and the second electrode 380, respectively, according to their own electrical polarities. In such a way, a photocurrent variation occurs.

Furthermore, as shown in FIG. 2, the TFT array substrate 300 may further includes a protection layer 375 covering the source electrode 370S and the drain electrode 370D. The protection layer 375 is configured with a first opening H1 and a second opening H2. The first opening H1 exposes a part of the source electrode 370S or a part of the drain electrode 370D. The second opening H2 exposes a part of the photosensitive dielectric layer 330. Further, the TFT array substrate 300 may further includes a pixel electrode 382. The pixel electrode 382 is electrically connected to the drain electrode 370D via the first opening H1. In other embodiments, the drain electrode 370D and the source electrode 370S can be exchanged each other, so that the pixel electrode 382 is electrically connected to the source electrode 370S. The pixel electrode 382 and the TFT T of each pixel region 130 constitute a pixel unit P. If possible, the TFT T of each pixel region 130 will include a storage capacitor (not shown), for achieving an improved displaying performance. The second electrode 380 is connected to the photosensitive dielectric layer 330 via the second opening H2. The second electrode 380 and the pixel electrode 382 are made of a same material. In other words, the second electrode 380 for example is made of a transparent conductive material, and therefore the photosensor 390 obtains a larger photo-sensing area, and thus achieving an improved photo-sensing capability.

In the current embodiment, the TFT array substrate 300 is characterized in that the pixel unit P in the pixel region 130 and the photosensor 390 in the photosensitive region 140 can be fabricated at the same time, so as to form the gate electrode 322 and the first electrode 324, and the pixel electrode 382 and the second electrode 380. Further, the gate electrode 322 and the first electrode 324 are obtained by patterning the first conductive layer 320, and the pixel electrode 382 and the second electrode 380 are obtained by patterning a second conductive layer 370. The photosensitive dielectric layer 330 for example is fabricated, when performing the patterning process to form the gate electrode 322 and the first electrode 324, with a same halftone mask used by the patterning process.

For further illustration of the technical content of the present invention, several methods for fabricating the TFT array substrate 300 according to the present invention are going to be exemplified incorporating with drawings below, in which FIGS. 3A through 3F illustrate a flow of fabricating a TFT array substrate by performing 5 stages of mask processes; FIGS. 4A through 4F illustrate a flow of fabricating a TFT array substrate by performing 4 stages of mask processes; and FIGS. 5A through 5H illustrate a flow of fabricating a TFT array substrate by performing 3 stages of mask processes.

FIGS. 3A though 3G sequentially illustrate a flow of fabricating a TFT array substrate according to an embodiment of the present invention. Referring to FIGS. 3A and 3B, a substrate 310 is provided. The substrate 310 for example is a transparent substrate, e.g., a glass substrate, a quartz substrate, or a plastic substrate. The substrate 310 includes at least a pixel region 130 and a photosensitive region 140 configured and disposed thereon as discussed above. As shown in FIG. 3B, a first patterned conductive layer 320 is formed on the substrate 310. The first patterned conductive layer 320 includes a gate electrode 322 in the pixel region 130 and a first electrode 324 in the photosensitive region 140. A photosensitive dielectric layer 330 is formed on the first electrode 324.

Further, as shown in FIG. 3A, a method of forming the gate electrode 322, the first electrode 324, and the photosensitive dielectric layer 330 for example includes the following steps. First, a first conductive layer 320', a photosensitive dielectric material layer 330' are sequentially formed entirely on the substrate 310, in which the first conductive layer 320' for example is formed by a sputtering process, an evaporation process or other film deposition processes. Then, a patterned photoresist layer 332 is formed on the photosensitive dielectric material layer 330'. The patterned photoresist layer 332 includes a first photoresist block 332A and a second photoresist block 332B. The first photoresist block 332A is positioned in the pixel region 130. The second photoresist block 332B is positioned in the photosensitive region 140. A thickness of the second photoresist block 332B is greater than a thickness of the first photoresist block 332A. The patterned photoresist layer 332 for example is formed by a halftone mask process or a grey-tone mask process. It should be further noted that in the current embodiment, the second photoresist block 332B may be further divided into a central block 334 and two lateral blocks 336, in which the central block 334 is positioned between the lateral blocks 336, and a thickness of the central block 334 is greater than a thickness of the two lateral blocks 336. The thickness of the two lateral blocks 336 is approximate to the thickness of the first photoresist block 332A. Of course, the second photoresist block 332B may have only one thickness, which is not restricted by the present invention.

Then, as shown in FIG. 3A, the patterned photoresist layer 332 is taken as a mask, to remove the first conductive layer 320' and the photosensitive dielectric material layer 330' which are not covered by the patterned photoresist layer 332. A thickness of the patterned photoresist layer 332 is reduced, until the first photoresist block 332A is removed. The thickness of the patterned photoresist layer 332 can be reduced by an ashing process. According to the current embodiment, the two lateral blocks 336 having a thickness approximate to the thickness of the first photoresist block 332A are also removed at the meantime. Then the rest second photoresist block 332B is taken as a mask, to remove the exposed photosensitive dielectric material layer 330', so that the photosensitive dielectric material layer 330' on the gate electrode 322 in the pixel region 130 is removed, thus forming the gate electrode 322, the first electrode 324, and the photosensitive dielectric layer 330.

More specifically, the photosensitive dielectric layer 330 can be made of a material selected in accordance with desired features, such as photosensitivity and reliability, for the photosensor 390. For example, the photosensitive dielectric layer 330 can be made of a silicon rich dielectric layer having a refractive index ranging from 1.8 to 3.7. Specifically, the photosensitive dielectric layer 330 can be made of silicon rich oxide ($SiO_x$), silicon rich nitride ($SiN_y$), and silicon rich carbide ($SiC_z$), in which $0.1 \leq x \leq 1.9$; $0.1 \leq y \leq 1.33$, and $0.1 \leq z \leq 1$. However, the present invention is not restricted to use the foregoing material for making the photosensitive dielectric layer 330, and other silicon rich composite can also be used.

It should be noted that the photosensitive dielectric material layer 330' is formed by a plasma enhanced chemical vapor deposition (PECVD) process, or other thin film deposition technologies. During the process of forming the film, silicon content is added into the film. The silicon content can be added into the film by increasing silicon content of the reactant gas, increasing a process bias applied to the substrate 310, or modulating a temperature of the substrate 310 when forming the film. Further, it has been found that the photocurrent characteristic of the photosensor 390 obtained from the photosensitive dielectric layer 330 will be affected by the temperature of forming the film. For example, a photosensitive dielectric layer 330 formed at a relative high temperature (e.g., 370° C.) has a better photocurrent performance than a photosensitive dielectric layer 330 formed at a relative low temperature (e.g., 280° C.). The photocurrent of the photosensitive dielectric layer 330 formed at the relative high temperature is about 7.68 times of the photocurrent of the photosensitive dielectric layer 330 formed at the relative low temperature. Related data is to be discussed below referring to FIG. 6.

During the process of integrating the photosensor 390 into the TFT array substrate 300, the process temperature of the photosensitive dielectric layer 330 which is the photosensitive material of the photosensor 390 is restricted by a process temperature tolerated by the process of the TFT T. It should be noted that being restricted by the process, a process temperature tolerated by a posterior process stage of the TFT array substrate 300 is often lower than a process temperature tolerated by an anterior process stage of the TFT array substrate 300. As such, if the process of fabricating the photosensitive dielectric layer 330 can be completed during the anterior process stage, the photosensitive dielectric layer 330 can be formed with a film at a higher temperature, and therefore the entire photoelectric performance of the photosensor 390 can be improved. After forming the first conductive layer 320', the present invention starts to form photosensitive dielectric material layer 330', and therefore the film of the photosensitive dielectric material layer 330' can be formed at a relative high temperature, which is helpful to increase the photocurrent of the photosensitive dielectric layer 330, and improve the entire photoelectric performance of the photosensor 390.

Figure 3C:
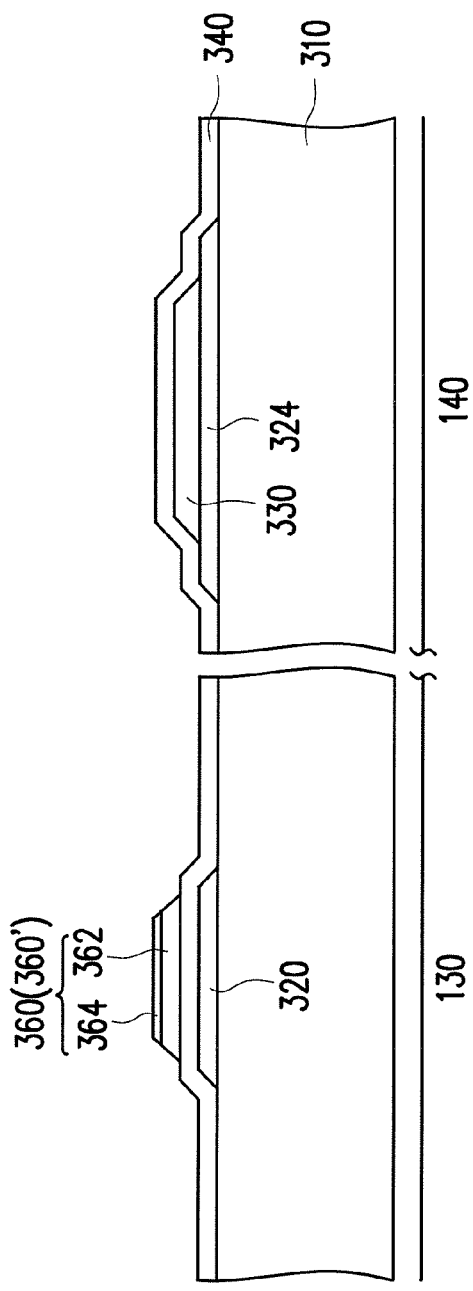

Then, as shown in FIG. 3C, a gate insulation layer 340 is formed on the substrate 310. The gate insulation layer 340 covers the gate electrode 322, the photosensitive dielectric layer 330 and the first electrode 324. Then, a patterned semiconductor layer 360 is formed on the gate insulation layer 340 over the gate electrode 322. The gate insulation layer 340 for example is made of a dielectric layer, such as silicon oxide, silicon nitride, silicon oxynitride, or a stack of the foregoing. The gate insulation layer 340 for example can be formed by a chemical vapour deposition (CVD) process, or other suitable thin film deposition processes. Further, in the current embodiment, the patterned semiconductor layer 360 for example is formed by entirely depositing a semiconductor layer 360' by a CVD process, and then patterning the semiconductor layer 360' to configure the patterned semiconductor layer 360. In the current embodiment, the patterned semiconductor layer 360 includes a channel layer 362 and an ohmic contact layer 364 disposed on the channel layer 362. The channel layer 362 and the ohmic contact layer 364 for example are made of amorphous silicon and an N-type heavily doped amorphous silicon, formed by for example a CVD process.

Figure 3D:
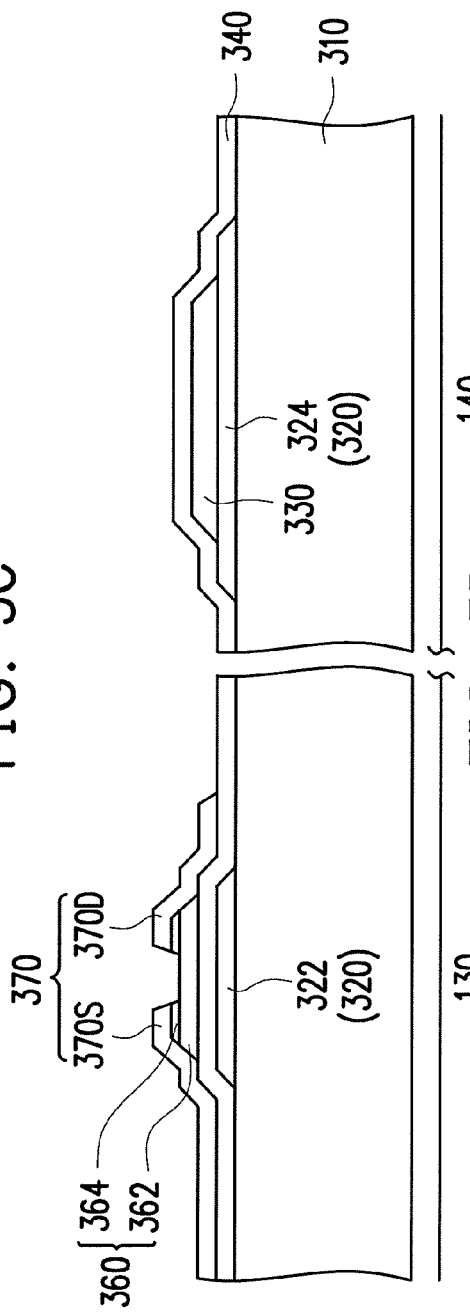

Then, as shown in FIG. 3D, a source electrode 370S and a drain electrode 370D are formed on the patterned semiconductor layer 360 at two sides of the gate electrode 322. The source electrode 370S and the drain electrode 370D for example are formed by forming a second conductive layer 370 covering the patterned semiconductor layer 360 and the gate insulation layer 340, and then patterning the second conductive layer 370. The second conductive layer 370 for example is made of a material such as aluminium (Al), molybdenum (Mo), titanium (Ti), neodymium (Nd), or nitrides of the foregoing such as molybdenum nitride (MoN), titanium nitride (TiN), stacks of the foregoing, or alloys of the foregoing, or other suitable conductive materials. The gate electrode 322, the source electrode 370S, and the drain electrode 370D constitute the TFT T.

Further, in the current embodiment, the ohmic contact layer 364 is provided for decreasing a contact resistance between the channel layer 362 and the source electrode 370S, and a contact resistance between the channel layer 362 and the drain electrode 370D. In order to prevent the ohmic contact layer 364 on the channel layer 362 from causing a short circuit between the source electrode 370S and the drain electrode 370D, which destroys a switching characteristic of the TFT T, when forming the source electrode 370S and the drain electrode 370D, the ohmic contact layer 364 exposed by the source electrode 370S and the drain electrode 370D are also removed. In the practical process, when removing the ohmic contact layer 364 exposed by the source electrode 370S and the drain electrode 370D, a part of the channel layer 362 under the ohmic contact layer 364 exposed by the source electrode 370S and the drain electrode 370D is also removed.

Figure 3E:
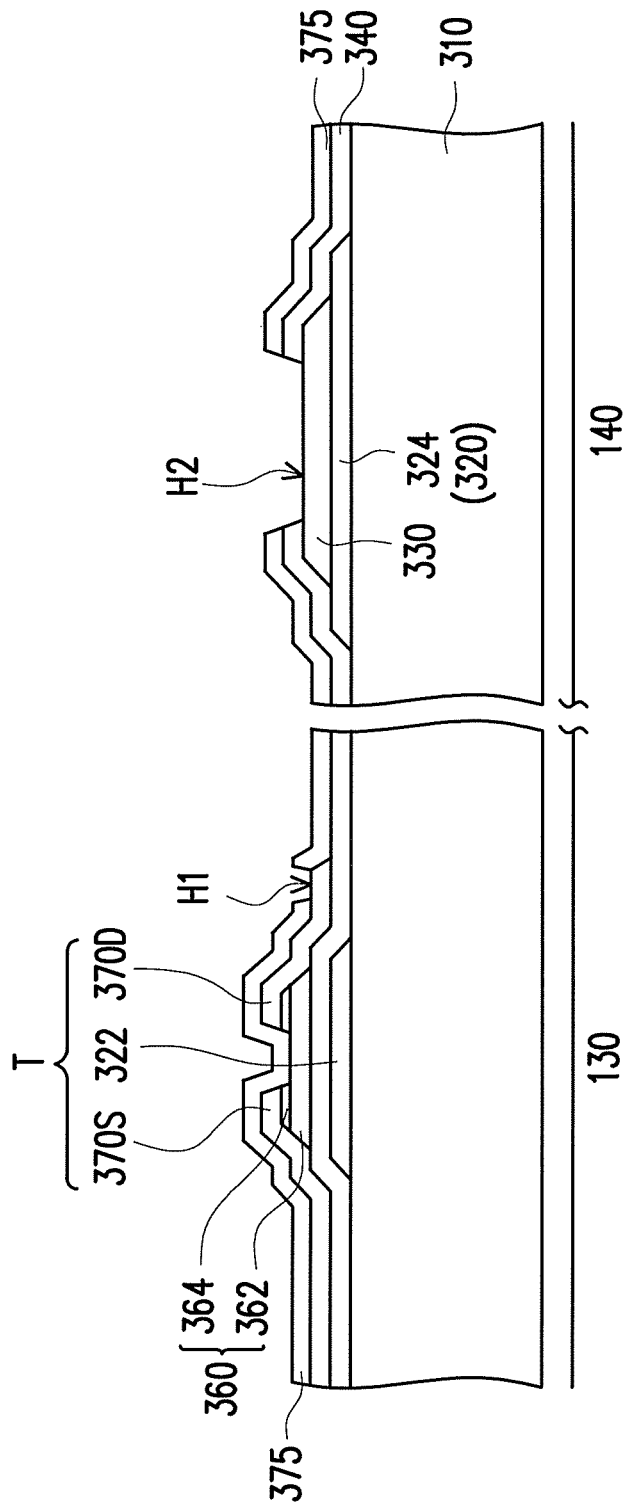

In the current embodiment, as shown in FIG. 3E, after forming the source electrode 370S and the drain electrode 370D, a protection layer 375 can be formed entirely covering the TFT T for protecting the components on the substrate 310. Of course, the TFT array substrate 300 can be further equipped with other components in accordance with its application. For example, in the current embodiment, the TFT array substrate 300 is for applying in an LCD, and therefore the TFT T for example, together with the pixel electrode 382, constitutes a pixel unit P, as shown in FIG. 2.

As shown in FIG. 3E, the method for fabricating the TFT array substrate 300 further includes removing a part of the protection layer 375 on the TFT T, so as to configure a first opening H1. The first opening H1 exposes a part of the source electrode 370S or a part of the drain electrode 370D, according to the type of the TFT T. Then, a part of the protection layer 375 in the photosensitive region 140 and a corresponding part of gate insulation layer 340 under the protection layer 375 are removed to configure a second opening H2 exposing a part of the photosensitive dielectric layer 330. The protection layer 375 for example can be made of an inorganic insulation material, such as silicon oxide, silicon nitride, or silicon oxynitride. The protection layer 375 for example can be formed by a suitable thin film deposition process, e.g., a CVD process. In other embodiments, the protection layer 375 can also be made of an organic insulation material such as an acrylic resin. The organic insulation material is usually photosensitive. The protection layer 375 made of such an organic insulation material is often formed by spin coating the organic insulation material and then performing steps of soft baking, exposing, developing, and hard baking.

Figure 3F:
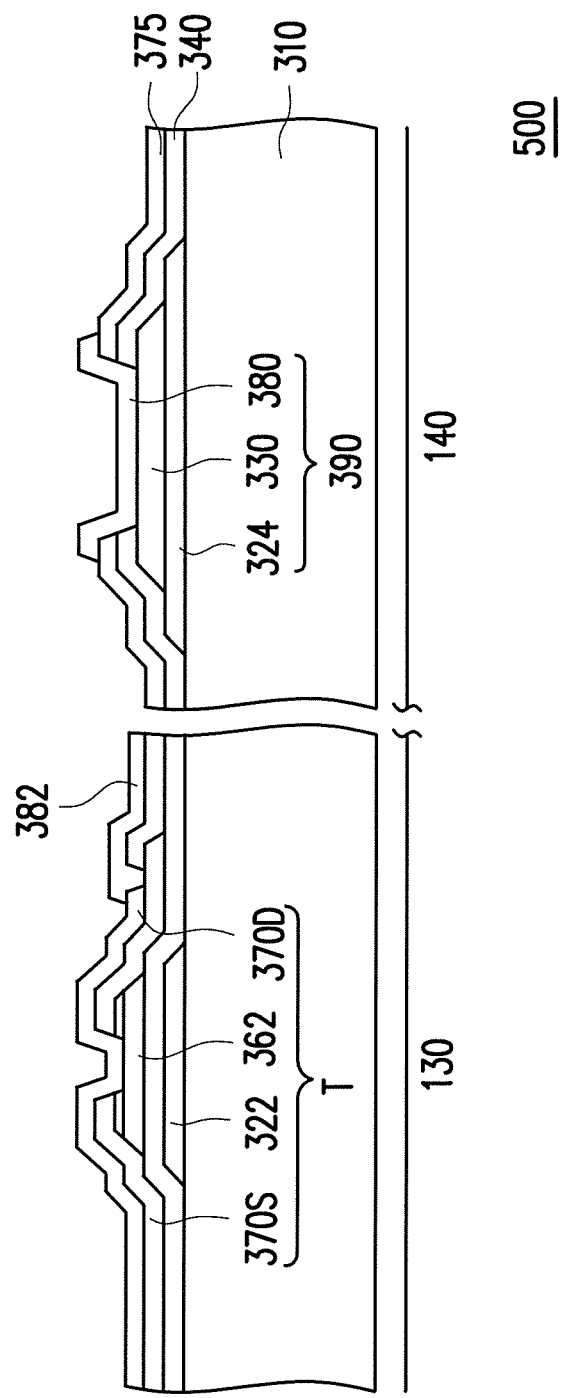
Figure 3F:
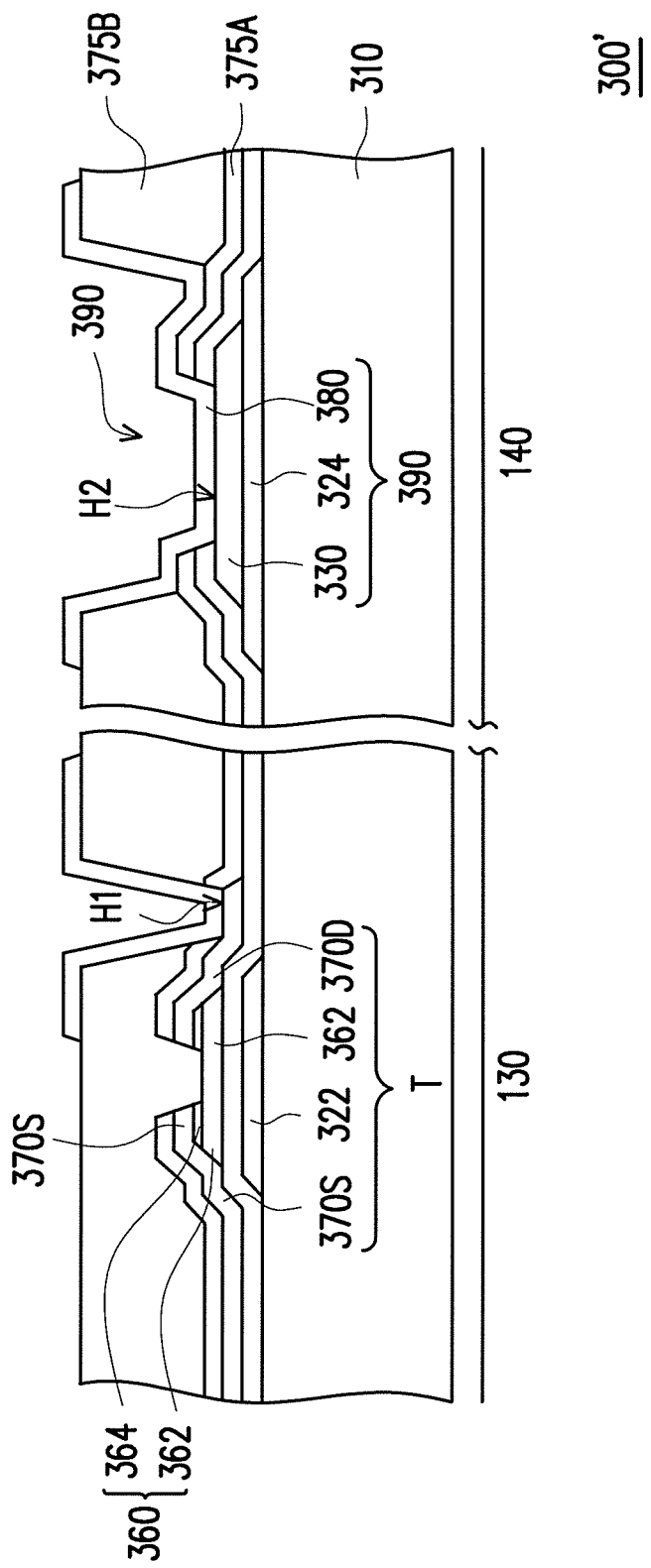

Then, as shown in FIG. 3F, the pixel electrode 382 electrically connected to the TFT T can be simultaneously formed when forming the second electrode 380. The second electrode 380 and the pixel electrode 382 for example can be formed by forming a transparent conductive layer (not shown) on the protection layer 375 and then patterning transparent conductive layer to configure the pixel electrode 382 and the second electrode 380. The transparent conductive layer for example is made of indium tin oxide (ITO), indium zinc oxide (IZO), or other transparent conductive materials. The pixel electrode 382 is coupled to the source electrode 370S or the drain electrode 370D corresponding thereto via the first opening H1. The second electrode 380 is stacked on the photosensitive dielectric layer 330 via the second opening H2 and is in contact with the photosensitive dielectric layer 330. In such a way, the first electrode 324 the photosensitive dielectric layer 330, and the second electrode 380 constitute the photosensor 390, for detecting a variation of light caused by a touch control operation by a user, or detecting a variation of ambient light.

Further, because the second electrode 380 of the photosensor 390 is a transparent conductive layer, the ambient light can directly pass through the second electrode 380 and illuminate onto the photosensitive dielectric layer 330. This is very much helpful for increasing the photo-sensing area of the photosensor 390, so as to improve the photo-sensing capability thereof. Furthermore, the first electrode 324 is a metal electrode, and therefore when the TFT T is employed in an LCD, the first electrode 324 is adapted for effectively preventing the backlight source electrode from directly illuminating the photosensitive dielectric layer 330, and thus avoiding prospective noises. It should be noted that as shown in FIG. 3F, the protection layer 375 for example can be a single film layer composed of an inorganic insulation material. FIG. 3F' is a schematic diagram illustrating a TFT array substrate according to another embodiment of the present invention. Referring to FIG. 3F', it shows a TFT array substrate 300' including a protection layer 375. The protection layer 375 of the TFT array substrate 300' can be a stack of an inorganic insulation material 375A and an organic insulation material 375B as shown in FIG. 3F'. Configuration and formation of the protection layer 375 are not restricted by the present invention.

The foregoing embodiments illustrate a method of fabricating the TFT array substrate 300 by performing 5 stages of mask processes. The process of fabricating the TFT array substrate 300 can be further simplified in accordance with practical consideration of the mask preparation, the production cost, or the production capability. Process flows including 4 stages of mask processes and 3 stages of mask processes, respectively are to be further illustrated below for further saving the production cost.

Figure 4C:
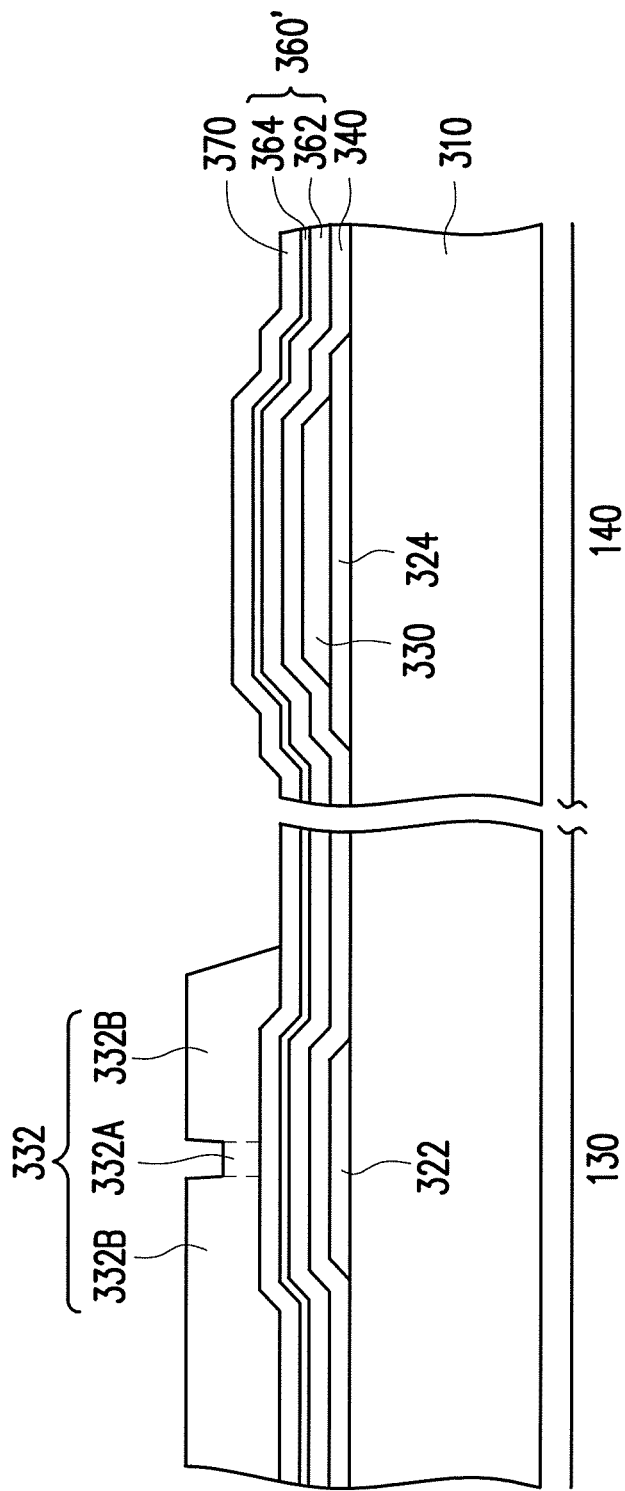
Figure 4D:
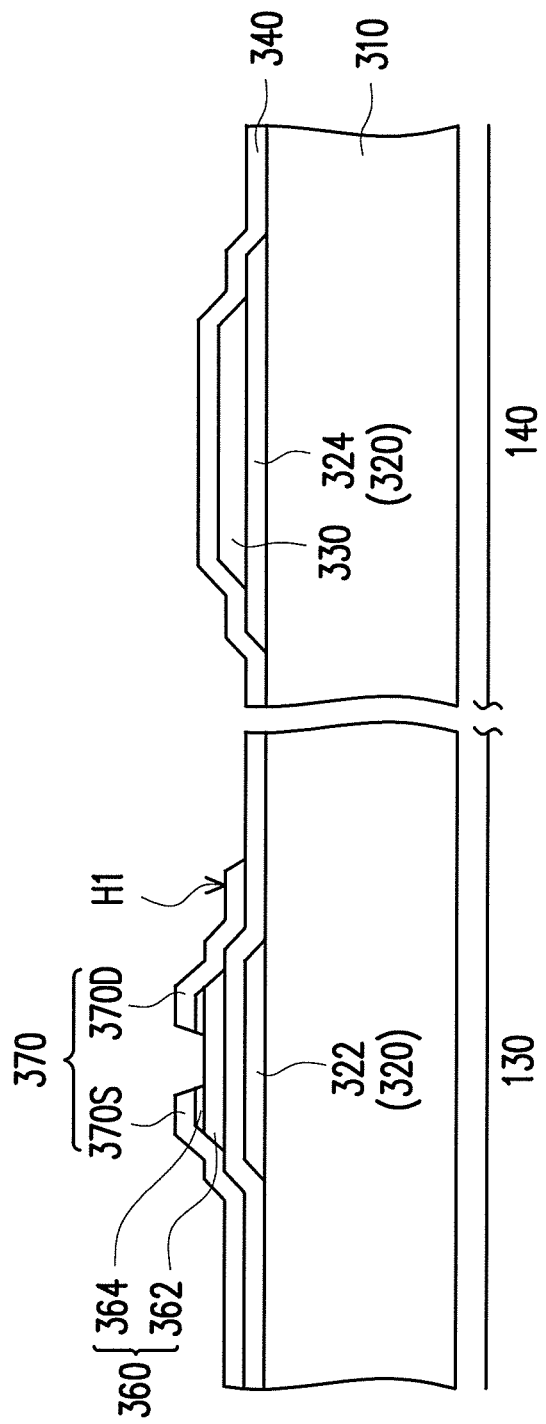
Figure 4E:
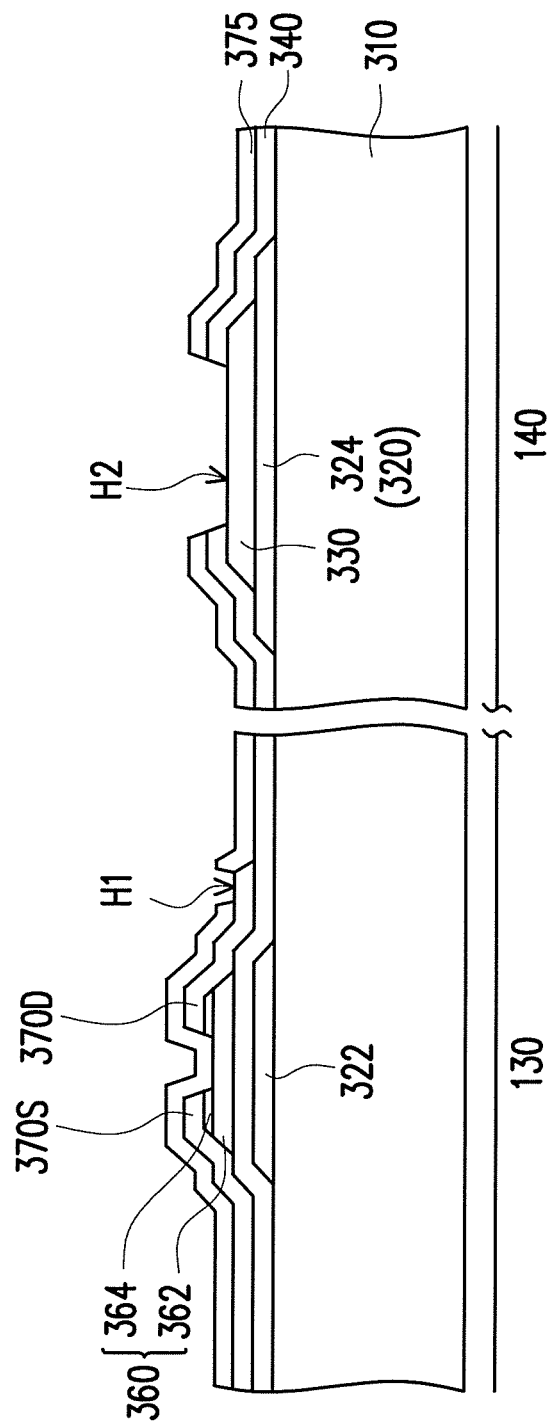
Figure 4F:
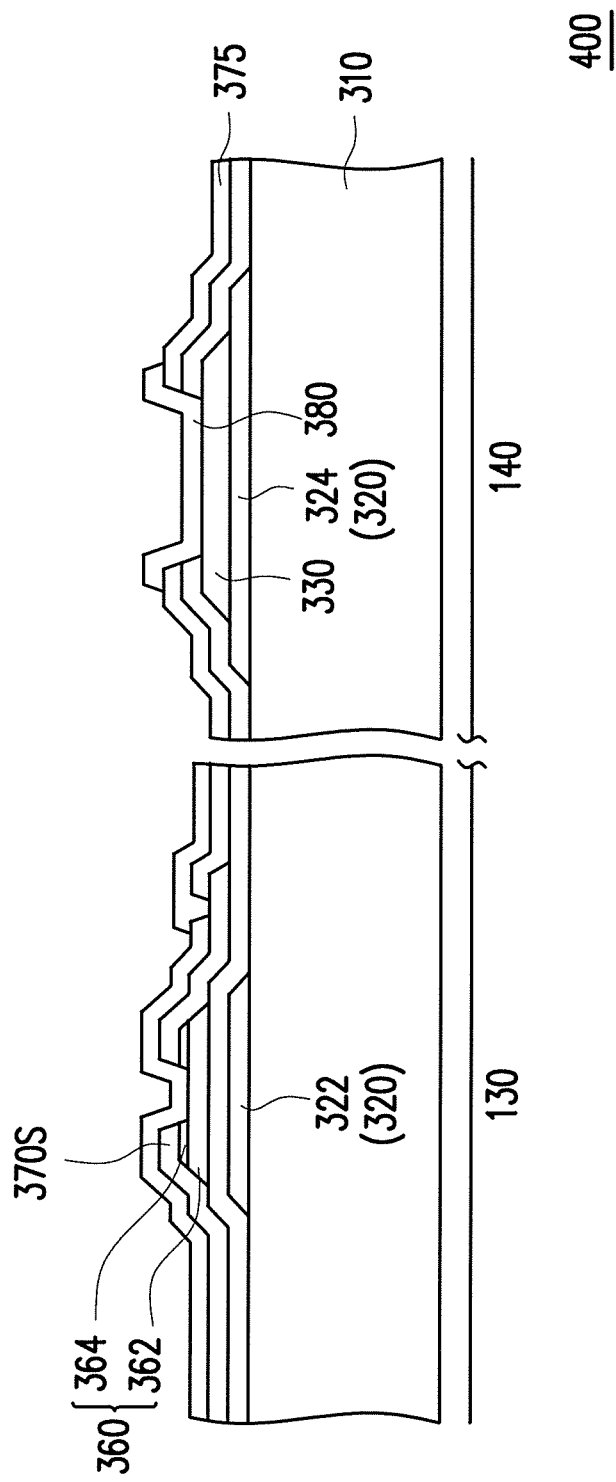

FIGS. 4A through 4F further illustrate a flow of fabricating a TFT array substrate according to an embodiment of the present invention, which sequentially illustrate a flow of fabricating a TFT array substrate 400 by performing 4 stages of mask processes. For simplification of illustration, like parts of the current embodiment similar to those shown in FIGS. 3A through 3F are not to be iterated hereby. As shown in FIGS. 4C and 4D, comparing with the TFT array substrate 300 of the foregoing embodiment, in the method for fabricating the TFT array substrate 400, the patterned semiconductor layer 360, the source electrode 370S and the drain electrode 370D are formed at the same time. Specifically, referring to FIG. 4C, after forming the gate electrode 322, the first electrode 324, and the photosensitive dielectric layer 330, a gate insulation layer 340, a semiconductor layer 360', a second conductive layer 370, and a patterned photoresist layer 332 are sequentially formed entirely on the substrate 310. The semiconductor layer 360' for example is a stack constituted by a channel layer 362 and an ohmic contact layer 364. The patterned photoresist layer 332 for example includes a first photoresist block 332A and a second photoresist block 332B positioned at two sides of the first photoresist block 332A. A thickness of the first photoresist block 322A is smaller than a thickness of the second photoresist block 322B. The first photoresist block 332A and the second photoresist block 332B of the patterned photoresist layer 332 for example are formed by a halftone mask process or a grey-tone mask process. Then, the patterned photoresist layer 332 is taken as a mask to perform a first etching process to the second conductive layer 370 and the semiconductor layer 360'. Then, the thickness of the patterned photoresist layer 332 is reduced, until the first photoresist block 332A is completely removed. The thickness of the patterned photoresist layer 332 for example can be removed by an ashing process. Then, as shown in FIG. 4D, the rest second photoresist block 332B is taken as a mask to perform a second etching process to the second conductive layer 370, to configure the second conductive 370 into the source electrode 370S and the drain electrode 370D. The semiconductor layer 360' is configured into the patterned semiconductor layer 360.

FIGS. 4A through 4F illustrate the process of fabricating the TFT array substrate 400 by performing 4 stages of mask processes. The process of fabricating the TFT array substrate can be further simplified to fabricate the TFT array substrate by 3 stages of mask processes, as illustrated below, for shortening the processing time and further saving the production cost.

Figure 5A:
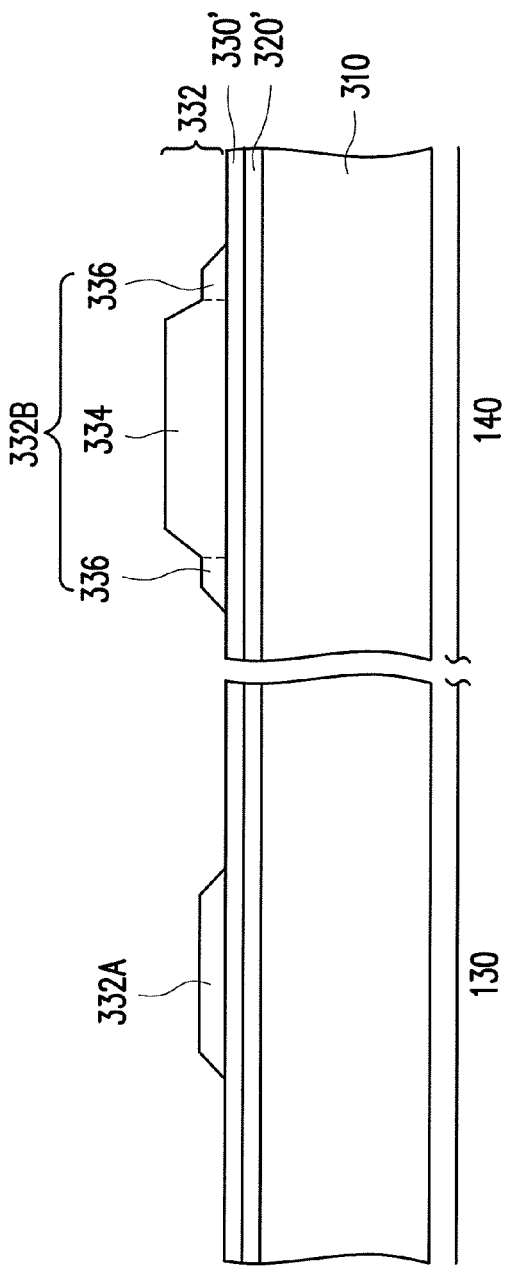
FIGS. 5A through 5H further illustrate a flow of fabricating a TFT array substrate according to an embodiment of the present invention.
Figure 5B:
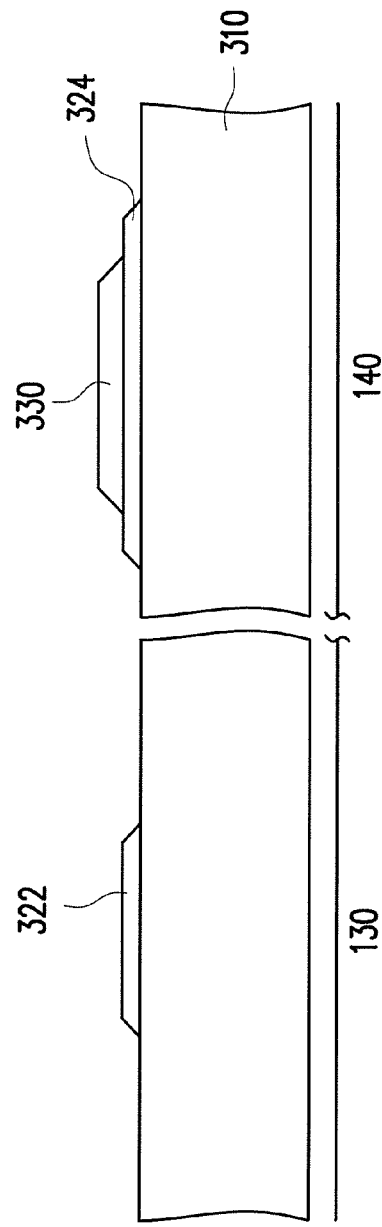
Figure 5C:
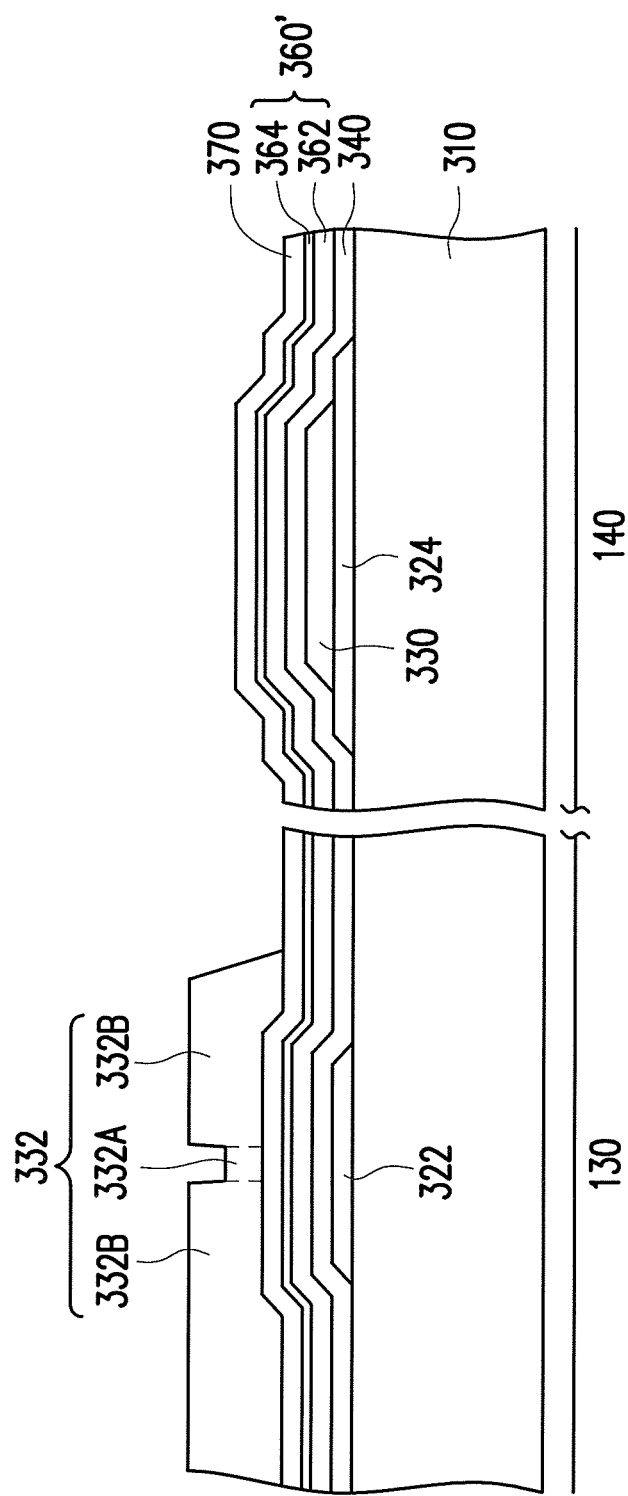
Figure 5D:
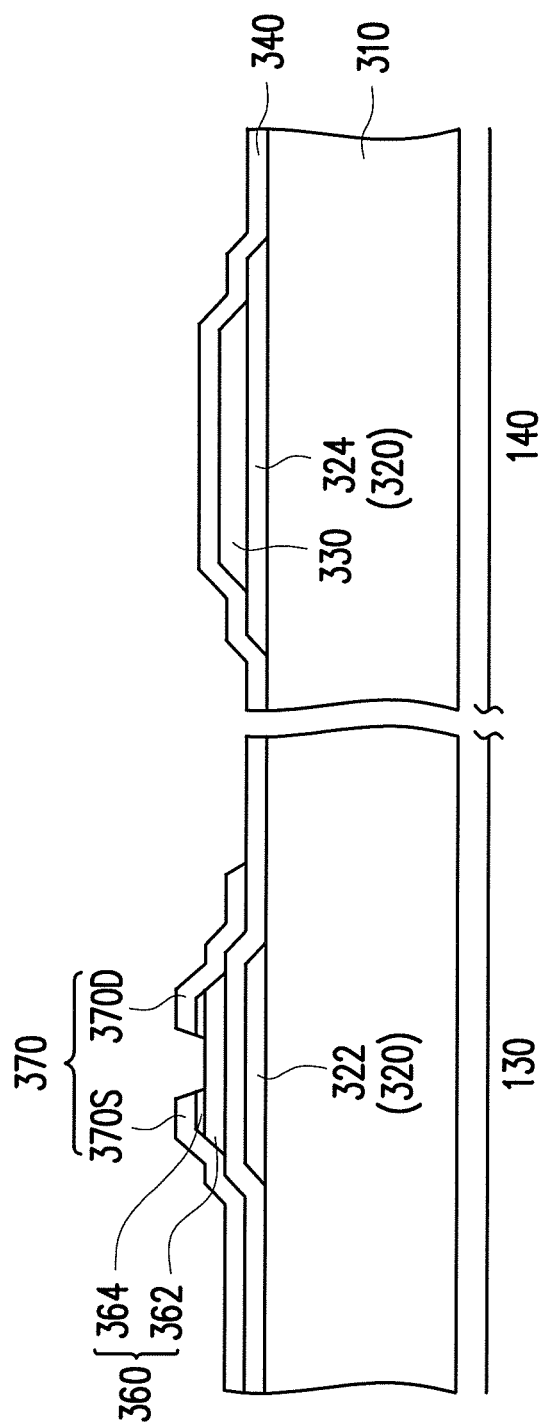
Figure 5E:
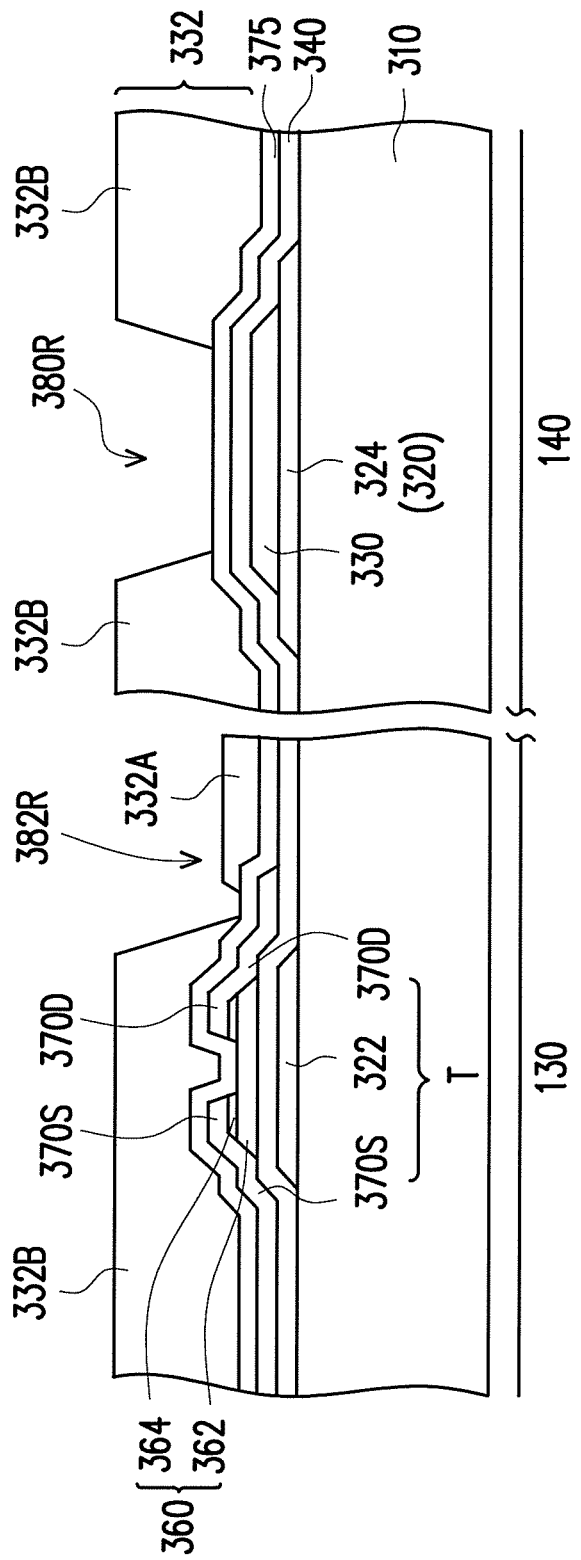

FIGS. 5A through 5H further illustrate a flow of fabricating a TFT array substrate according to an embodiment of the present invention, which sequentially illustrate a flow of fabricating a TFT array substrate 500 by performing 3 stages of mask processes. For simplification of illustration, like parts of the current embodiment similar to those shown in FIGS. 4A through 4F are not to be iterated hereby. As shown in FIGS. 5E through 5H, comparing with the TFT array substrate 400 of the foregoing embodiment, in the method for fabricating the TFT array substrate 500, a mask patterning process to the conventional second electrode 380 and the pixel electrode 382 can be saved. Specifically, as shown in FIG. 5E, after forming the source electrode 370S and the drain electrode 370D, a protection layer 375 is formed covering the source electrode 370S, the drain electrode 370D, and the gate insulation layer 340. Then, a photoresist layer is formed on the protection layer 375. The photoresist layer is then patterned to form a patterned photoresist layer 332. The patterned photoresist layer 332 exposes a part of the protection layer 375 on the TFT T, and a part of the protection layer 375 on the photosensitive dielectric layer 330. The exposed part of the protection layer 375 on the TFT T is over the drain electrode or the source electrode. The exposed part of the protection layer 375 on the photosensitive dielectric layer 330 is a preset region 380R for forming the second electrode 380. In the current embodiment, the patterned photoresist layer 332 includes a first photoresist block 332A and a second photoresist block 332B. The first photoresist block 332A has a smaller thickness than the second photoresist block 332B. The first photoresist block 332A is a preset region 382R for forming the pixel electrode 382R.

Figure 5F:
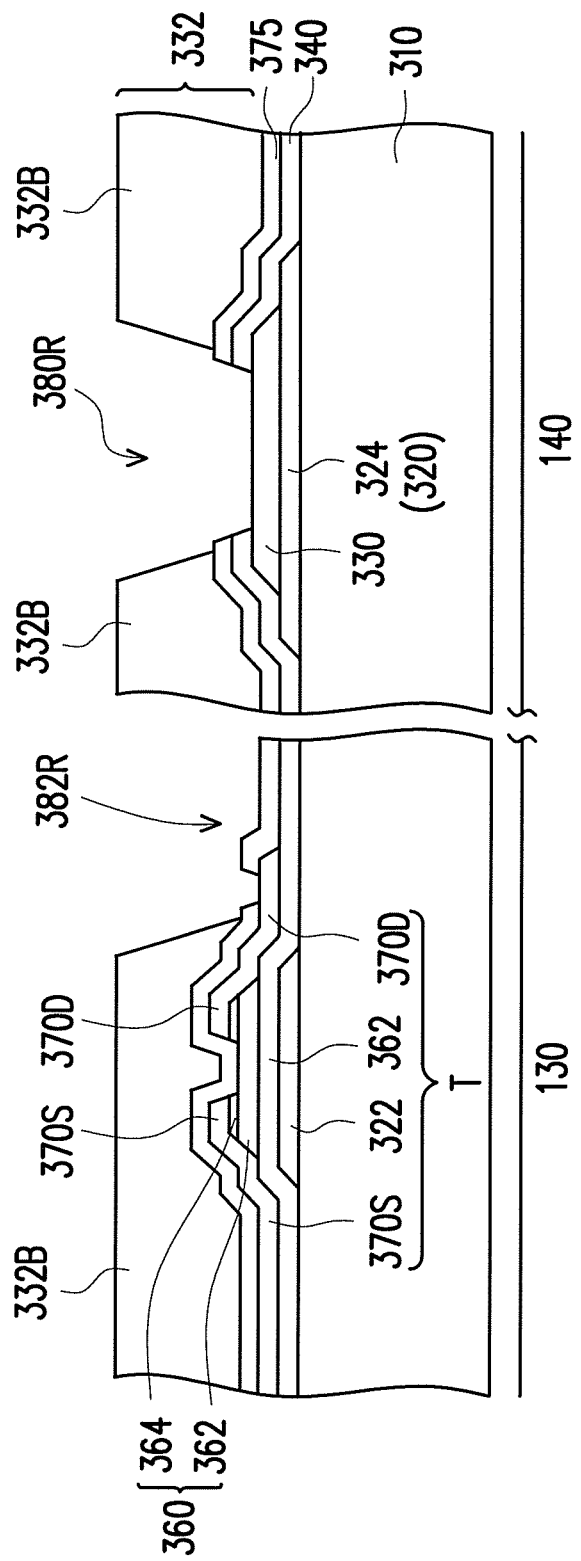
Figure 5G:
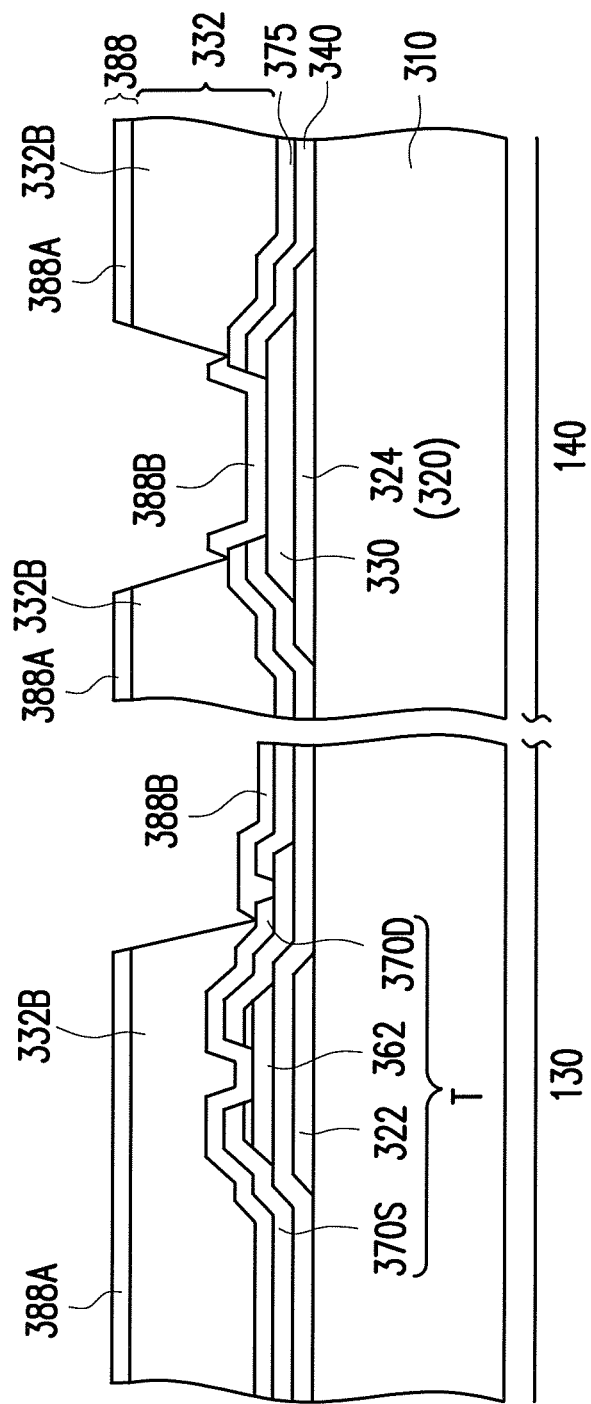

Then, as shown in FIG. 5F, the patterned photoresist layer 332 is taken as a mask to perform an etching process, to remove the part of protection layer 375 on the TFT T, and remove the part of the protection layer 375 in the photosensitive region 140, and a part of the gate insulation layer 340, to expose the drain electrode 370D or the source electrode 370S, and the photosensitive dielectric layer 330. Then, in the current embodiment, an ashing process is performed to reduce the thickness of the patterned photoresist layer 332, until the first photoresist block 332A is completely removed, to expose the preset region 382R for forming the pixel electrode 382. Then, as shown in FIG. 5G, a transparent conductive layer 388 is formed on the substrate 310, entirely covering the substrate 310. The transparent conductive layer 388 for example can be formed by sputtering an ITO layer or an IZO layer on the substrate 310. As a bottom layer of the transparent conductive layer 388, the patterned photoresist layer 322 has a proper thickness. Because the deposition process of the transparent conductive layer 388 has an anisotropic characteristic, two parts 388A and 388B which are electrically insulated one from another are configured when forming the transparent conductive layer 388. The part 388A is disposed on the second photoresist block 332B, and the part 388B is disposed on the protection layer 375.

Figure 5H:
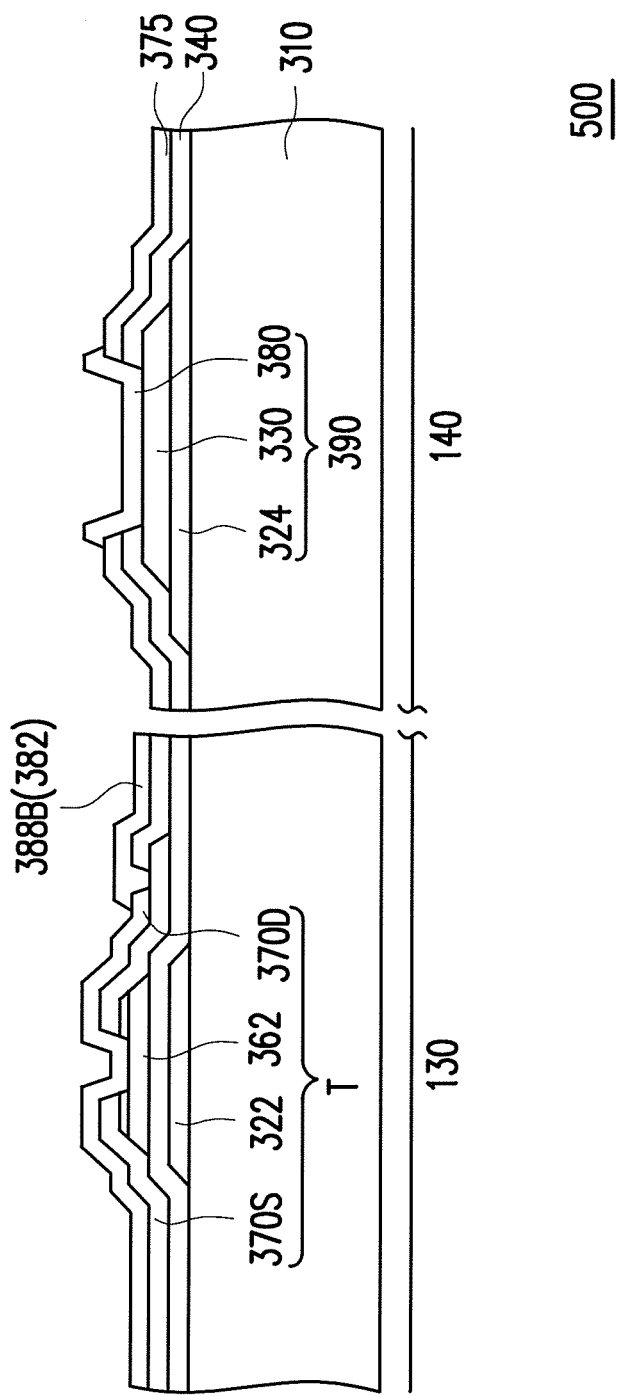

Then, as shown in FIG. 5H, a peeling off process is performed to simultaneously remove the patterned photoresist layer 332 and the transparent conductive layer 388A on the patterned photoresist layer 332, and thus a part the rest transparent conductive layer which connects to the drain electrode 370D or the source electrode 370S constituting the pixel electrode 382, and the a part of the rest transparent conductive layer 388 which connects to the photosensitive dielectric layer 330 constituting the second electrode 380. It should be noted that the present invention, different from the conventional, employs a pattered photoresist layer 332 having an appropriate pattern, to pattern the transparent conductive layer 388 when forming the transparent conductive layer 388 to complete the fabrication of the pixel electrode 382 and the second electrode 380. In such a way, the embodiment of the present invention further saves a stage of mask process, and thus simplifying the complexity of the process, and saving the production cost.

Figure 6:
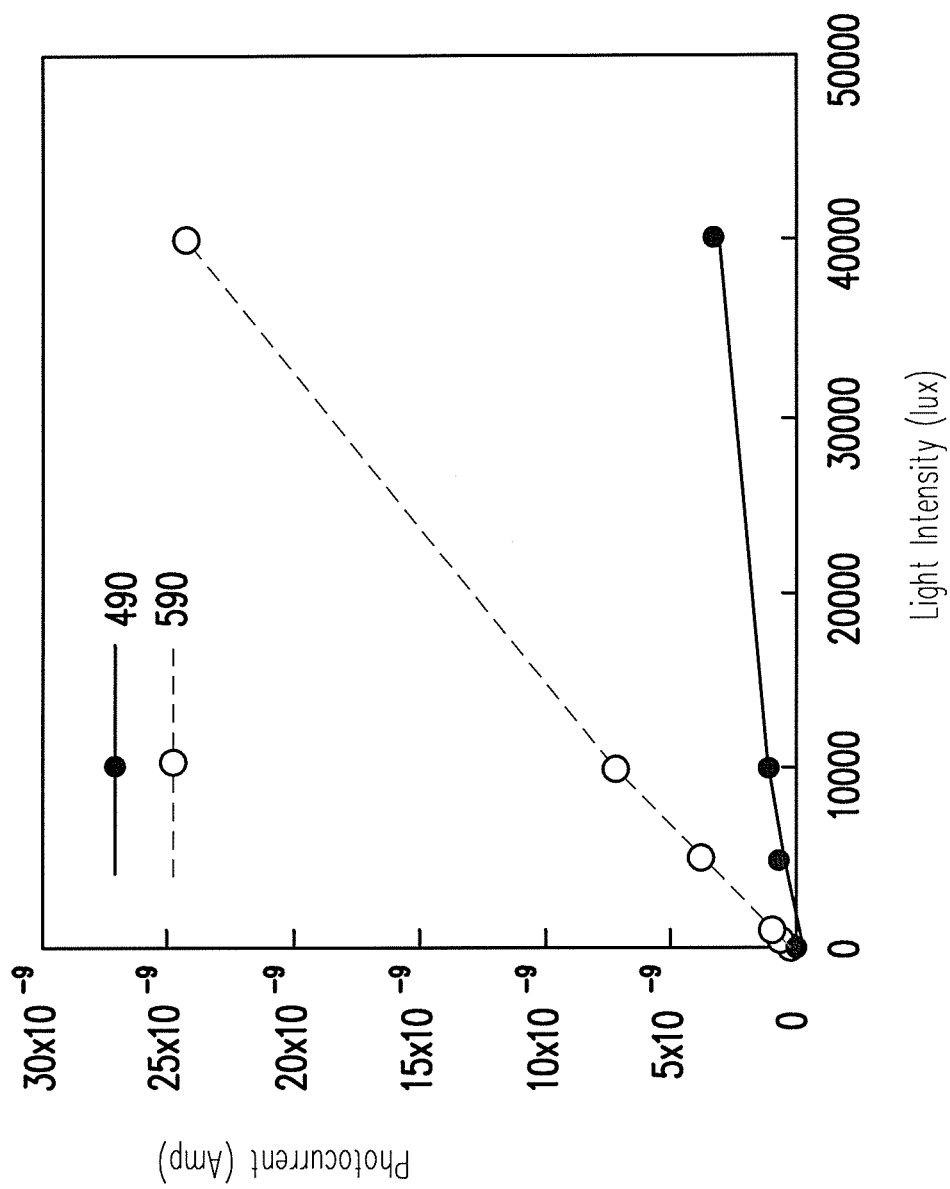
FIG. 6 is a "light intensity v. photocurrent" characteristic curve of a photosensor in application according to an embodiment of the present invention.

FIG. 6 is a "light intensity v. photocurrent" characteristic curve of a photosensor in application according to an embodiment of the present invention. In the current embodiment of FIG. 6, the photosensitive dielectric layer of the photosensor 590 is formed with a film at about 370° C., while the photosensitive dielectric layer of the photosensor 490 is formed with a film at about 280° C. It can be learnt by referring to FIG. 6, the photosensor 590 which film is formed at 370° C. has a larger photocurrent that is about 7.68 times of that of the photosensor 490 which film is formed at 280° C. In other words, the photosensitive dielectric layer of the present invention is taken earlier for fabricating together with the first mask process. Therefore, the present invention not only does not spend production cost on additional mask, but also allows the photosensitive dielectric layer to form film at a relative high temperature because of the higher process temperature tolerated by the anterior process stage, and thus improving the photoelectric efficiency of the photosensor.

It will be apparent to those skilled in the art that various modifications and variations can be made to the structure of the present invention without departing from the scope or spirit of the invention. In view of the foregoing, it is intended that the present invention cover modifications and variations of this invention provided they and their equivalents fall within the scope of the following claims.

What is claimed is:
1. A method for fabricating a thin film transistor (TFT) array substrate, comprising:
   providing a substrate having a pixel region and a photosensitive region formed thereon;
   forming a first patterned conductive layer on the substrate, wherein the first patterned conductive layer comprises a gate electrode disposed in the pixel region and a first electrode disposed in the photosensitive region, and a photosensitive dielectric layer is formed on the first electrode, the photosensitive dielectric layer is a silicon rich dielectric layer comprising a silicon rich oxide layer, a silicon rich nitride layer, or a silicon rich carbide layer, the silicon rich oxide is represented with a molecular formula of SiOx, the silicon rich nitride is represented with a molecular formula of SiNy, and the silicon rich carbide is represented with a molecular formula of SiCz, wherein $0.01 \leq y \leq 1.33$ and $0.01 \leq z \leq 1$;

forming a gate insulation layer on the substrate for covering the gate electrode, the photosensitive dielectric layer and the first electrode;

forming a patterned semiconductor layer on the gate insulation layer above the gate electrode;

forming a source electrode and a drain electrode on the patterned semiconductor layer at two sides of the gate electrode, respectively, wherein the gate electrode, the source electrode, and the drain electrode constitute a TFT; and forming a second electrode on the photosensitive dielectric layer, wherein the first electrode, the photosensitive dielectric layer and the second electrode constitute a photosensor.

2. The method for fabricating a TFT array substrate according to claim 1, further comprising:

after forming the source electrode and the drain electrode, forming a protection layer entirely on the substrate.

3. The method for fabricating a TFT array substrate according to claim 2, further comprising:

removing a part of the protection layer on the TFT, to configure a first opening exposing a part of the source electrode or a part of the drain electrode; and removing a part of the protection layer in the photosensitive region and a part of the gate insulation layer thereunder, to configure a second opening exposing a part of the photosensitive dielectric layer.

4. The method for fabricating a TFT array substrate according to claim 3, wherein the step of forming the second electrode on the photosensitive dielectric layer further comprises forming a pixel electrode connected to the TFT, wherein a process of forming the second electrode and the pixel electrode comprises:

forming a transparent conductive layer on the protection layer; and patterning the transparent conductive layer to form the pixel electrode and the second electrode, wherein the pixel electrode is electrically connected to the source electrode or the drain electrode via the first opening, and the second electrode is connected to the photosensitive dielectric layer via the second opening.

5. The method for fabricating a TFT array substrate according to claim 1, wherein the photosensitive dielectric layer has a refractive index ranging from 1.8 to 3.7.

6. The method for fabricating a TFT array substrate according to claim 1, wherein the gate electrode, the first electrode, and the photosensitive dielectric layer are formed by a method comprising:

sequentially forming a first conductive layer, a photosensitive dielectric material layer entirely on the substrate;

forming a patterned photoresist layer on the photosensitive dielectric material layer, wherein the patterned photoresist layer comprises a first photoresist block and a second photoresist block, wherein the first photoresist block is positioned in the pixel region, the second photoresist block is positioned in the photosensitive region, and a thickness of the second photoresist block is greater than a thickness of the first photoresist block;

taking the patterned photoresist layer as a mask, to remove the exposed first conductive layer and photosensitive dielectric material layer, so that the rest first conductive layer and photosensitive dielectric material layer in the photosensitive region constitute the first electrode and the photosensitive dielectric layer, respectively;

reducing a thickness of the patterned photoresist layer, until the first photoresist block is removed; and taking the rest patterned photoresist layer as a mask, to remove the exposed photosensitive dielectric material layer, so that the rest first conductive layer in the pixel region constitutes the gate electrode.

7. The method for fabricating a TFT array substrate according to claim 6, wherein the second photoresist block comprises a central block and two lateral blocks, wherein the central block is positioned between the lateral blocks, and a thickness of the central block is greater than a thickness of the two lateral blocks.

8. The method for fabricating a TFT array substrate according to claim 6, wherein the step of reducing the thickness of the patterned photoresist layer comprises performing an ashing process.

9. The method for fabricating a TFT array substrate according to claim 1, wherein the patterned semiconductor layer in the pixel region further comprises a channel layer, and an ohmic contact layer on the channel layer.

10. The method for fabricating a TFT array substrate according to claim 9, wherein when forming the source electrode and the drain electrode, the method further comprises removing the ohmic contact layer exposed by the source electrode and the drain electrode and a part of the channel layer.

11. The method for fabricating a TFT array substrate according to claim 1, wherein the step of forming the patterned semiconductor layer comprises:

forming a semiconductor layer covering the gate insulation layer; and patterning the semiconductor layer.

12. The method for fabricating a TFT array substrate according to claim 1, wherein the step of forming the source electrode and the drain electrode comprises:

forming a second conductive layer covering the patterned semiconductor layer and the gate insulation layer; and patterning the second semiconductor layer, to form the source electrode and the drain electrode.

13. The method for fabricating a TFT array substrate according to claim 1, wherein the gate electrode dielectric layer, the patterned semiconductor layer, the source electrode, and the drain electrode are formed at the same time.

14. The method for fabricating a TFT array substrate according to claim 13, wherein the step of forming the patterned semiconductor layer, the source electrode, and the drain electrode at the same time comprises:

sequentially forming a gate insulation layer, a semiconductor layer, a second conductive layer, and a patterned photoresist layer entirely on the substrate, wherein the patterned photoresist layer comprises a first photoresist block and a second photoresist block positioned at two sides of the first photoresist block, and a thickness of the first photoresist block is smaller than a thickness of the second photoresist block;

taking the patterned photoresist layer as a mask to perform a first etching process to the second conductive layer and the semiconductor layer;

reducing a thickness of the patterned photoresist layer, until the first photoresist block is completely removed; and taking the rest second photoresist block as a mask to perform a second etching process to the second conductive layer, thus configuring the second conductive layer to form the source electrode and the drain electrode, and configuring the semiconductor layer to form the patterned semiconductor layer.

15. The method for fabricating a TFT array substrate according to claim 3, wherein the protection layer is made of an organic insulation material.

16. The method for fabricating a TFT array substrate according to claim 3, wherein the protection layer is a stack constituted by an inorganic insulation material and an organic insulation material.

17. The method for fabricating a TFT array substrate according to claim 1, further comprising:
   after forming the source electrode and the drain electrode, forming a protection layer covering the source electrode, the drain electrode, and the gate insulation layer;
   forming a photoresist layer for covering the protection layer;
   patterning the photoresist layer to form a patterned photoresist layer, the patterned photoresist layer exposing a part of the protection layer over the TFT and a part of the protection layer over the photosensitive dielectric layer;
   taking the patterned photoresist layer as a mask to perform an etching process to remove the part of protection layer over the TFT, and remove a part of the protection layer of the photosensitive region, and a part of the gate insulation layer, so as to expose the drain electrode or the source electrode, and expose the photosensitive dielectric layer;
   forming a transparent conductive layer on the substrate, for entirely covering the substrate; and
   performing a peeling off process to simultaneously remove the patterned photoresist layer and the transparent conductive layer on the patterned photoresist layer, and thus a part of the rest transparent conductive layer which connects to the source electrode or the drain electrode constituting the pixel electrode, and a part of the rest transparent conductive layer which connects to the photosensitive dielectric layer constituting the second electrode.

18. The method for fabricating a TFT array substrate according to claim 1, wherein the photosensitive region is disposed at a peripheral of the pixel region.

19. The method for fabricating a TFT array substrate according to claim 1, wherein an amount of photosensitive region is a plurality, and each photosensitive region is correspondingly formed in a range of each pixel region.

20. A thin film transistor (TFT) array substrate, comprising:
   a substrate, having a pixel region and a photosensitive region;
   a patterned first conductive layer, is disposed on the substrate, wherein the first conductive layer comprises a gate electrode in the pixel region and a first electrode in the photosensitive region;
   a photosensitive dielectric layer, is disposed on the first electrode, wherein the photosensitive dielectric layer is a silicon rich dielectric layer comprising a silicon rich oxide layer, a silicon rich nitride layer, or a silicon rich carbide layer, the silicon rich oxide is represented with a molecular formula of SiOx, the silicon rich nitride is represented with a molecular formula of SiNy, and the silicon rich carbide is represented with a molecular formula of SiCz, wherein $0.01 \leq y \leq 1.33$ and $0.01 \leq z \leq 1$;
   a gate insulation layer, covering the gate electrode, the photosensitive dielectric layer and the first electrode;
   a patterned semiconductor layer, disposed on the gate insulation layer over the gate electrode;
   a source electrode and a drain electrode, disposed on the patterned semiconductor layer at two sides of the gate electrode, respectively, wherein the gate electrode, the source electrode, and the drain electrode constitute a TFT; and
   a second electrode, disposed on the photosensitive dielectric layer, wherein the first electrode, the photosensitive dielectric layer and the second electrode constitute a photosensor.

21. The TFT array substrate according to claim 20, further comprising a protection layer covering the source electrode and the drain electrode.

22. The TFT array substrate according to claim 21, wherein the protection layer is formed with a first opening and a second opening, wherein the first opening exposes a part of the source electrode or a part of the drain electrode, and the second opening exposes a part of the photosensitive dielectric layer.

23. The TFT array substrate according to claim 22 further comprising a pixel electrode, wherein the pixel electrode and the second electrode are made of a same material, while the pixel electrode is electrically connected to the source electrode or the drain electrode via the first opening, and the second electrode is connected to the photosensitive dielectric layer via the second opening.

24. The TFT array substrate according to claim 20, wherein the photosensitive dielectric layer has a refractive index ranging from 1.8 to 3.7.

25. A method for fabricating a thin film transistor (TFT) array substrate, comprising:
   providing a substrate having a pixel region and a photosensitive region formed thereon;
   forming a first patterned conductive layer on the substrate, wherein the first patterned conductive layer comprises a gate electrode disposed in the pixel region and a first electrode disposed in the photosensitive region, and a photosensitive dielectric layer is formed on the first electrode, the photosensitive dielectric layer is a silicon rich dielectric layer comprising a silicon rich oxide layer, and the silicon rich oxide is represented with a molecular formula of SiOx, wherein $0.1 \leq x \leq 1.9$;
   forming a gate insulation layer on the substrate for covering the gate electrode, the photosensitive dielectric layer and the first electrode;
   forming a patterned semiconductor layer on the gate insulation layer above the gate electrode;
   forming a source electrode and a drain electrode on the patterned semiconductor layer at two sides of the gate electrode, respectively, wherein the gate electrode, the source electrode, and the drain electrode constitute a TFT; and
   forming a second electrode on the photosensitive dielectric layer, wherein the first electrode, the photosensitive dielectric layer and the second electrode constitute a photosensor.

26. The method for fabricating a TFT array substrate according to claim 25, wherein the photosensitive dielectric layer has a refractive index ranging from 1.8 to 3.7.

27. The method for fabricating a TFT array substrate according to claim 25, wherein the patterned semiconductor layer in the pixel region further comprises a channel layer, and an ohmic contact layer on the channel layer.

28. The method for fabricating a TFT array substrate according to claim 25, wherein the step of forming the patterned semiconductor layer comprises:
   forming a semiconductor layer covering the gate insulation layer; and
   patterning the semiconductor layer.

29. The method for fabricating a TFT array substrate according to claim 25, wherein an amount of photosensitive region is a plurality, and each photosensitive region is correspondingly formed in a range of each pixel region.

30. A thin film transistor (TFT) array substrate, comprising:
   a substrate, having a pixel region and a photosensitive region;
   a patterned first conductive layer, is disposed on the substrate, wherein the first conductive layer comprises a gate electrode in the pixel region and a first electrode in the photosensitive region;
   a photosensitive dielectric layer, is disposed on the first electrode, wherein the photosensitive dielectric layer is a silicon rich dielectric layer comprising a silicon rich oxide layer, and the silicon rich oxide is represented with a molecular formula of SiOx, wherein $0.1 \leq x \leq 1.9$;
   a gate insulation layer, covering the gate electrode, the photosensitive dielectric layer and the first electrode;
   a patterned semiconductor layer, disposed on the gate insulation layer over the gate electrode;
   a source electrode and a drain electrode, disposed on the patterned semiconductor layer at two sides of the gate electrode, respectively, wherein the gate electrode, the source electrode, and the drain electrode constitute a TFT; and
   a second electrode, disposed on the photosensitive dielectric layer, wherein the first electrode, the photosensitive dielectric layer and the second electrode constitute a photosensor.

31. The TFT array substrate according to claim 30, further comprising a protection layer covering the source electrode and the drain electrode.

32. The TFT array substrate according to claim 30, wherein the protection layer is formed with a first opening and a second opening, wherein the first opening exposes a part of the source electrode or a part of the drain electrode, and the second opening exposes a part of the photosensitive dielectric layer.

33. The TFT array substrate according to claim 32 further comprising a pixel electrode, wherein the pixel electrode and the second electrode are made of a same material, while the pixel electrode is electrically connected to the source electrode or the drain electrode via the first opening, and the second electrode is connected to the photosensitive dielectric layer via the second opening.

34. The TFT array substrate according to claim 30, wherein the photosensitive dielectric layer has a refractive index ranging from 1.8 to 3.7.

* * * * *